United States Patent
Daly

(10) Patent No.: US 9,560,466 B2
(45) Date of Patent: Jan. 31, 2017

(54) SYSTEMS AND METHODS FOR SIMULATION OF MIXING IN AIR OF RECORDED SOUNDS

(71) Applicant: AmOS DM, LLC, Mill Valley, CA (US)

(72) Inventor: George William Daly, Mill Valley, CA (US)

(73) Assignee: AmOS DM, LLC, Mill Valley, CA (US)

(*) Notice: Subject to any disclaimer, the term of this patent is extended or adjusted under 35 U.S.C. 154(b) by 0 days.

(21) Appl. No.: 14/477,826

(22) Filed: Sep. 4, 2014

(65) Prior Publication Data

US 2015/0063573 A1    Mar. 5, 2015

Related U.S. Application Data

(60) Provisional application No. 61/874,099, filed on Sep. 5, 2013, provisional application No. 61/874,120, filed on Sep. 5, 2013, provisional application No. 61/874,150, filed on Sep. 5, 2013, provisional application No. 61/874,125, filed on Sep. 5, 2013, provisional application No. 61/874,137, filed on Sep.

(Continued)

(51) Int. Cl.
| | |
|---|---|
| H04S 7/00 | (2006.01) |
| H04S 5/00 | (2006.01) |
| G10H 5/07 | (2006.01) |
| H03G 5/00 | (2006.01) |
| G10H 1/00 | (2006.01) |
| H04R 3/04 | (2006.01) |

(52) U.S. Cl.
CPC .......... *H04S 7/302* (2013.01); *G10H 1/0033* (2013.01); *G10H 5/07* (2013.01); *H03G 5/00* (2013.01); *H04R 3/04* (2013.01); *H04S 5/00* (2013.01); *G10H 2210/265* (2013.01); *G10H 2210/291* (2013.01); *H04S 2400/15* (2013.01)

(58) Field of Classification Search
None
See application file for complete search history.

(56) References Cited

U.S. PATENT DOCUMENTS

| | | |
|---|---|---|
| 5,587,936 A | 12/1996 | Levitt et al. |
| 8,249,263 B2 | 8/2012 | Cragun |
| 9,432,792 B2 | 8/2016 | Daly |
| 2003/0007648 A1 | 1/2003 | Currell |
| 2007/0058816 A1 | 3/2007 | Ko |
| 2008/0273708 A1* | 11/2008 | Sandgren ............... G10K 15/08 381/63 |

(Continued)

FOREIGN PATENT DOCUMENTS

WO    WO-2015035093 A1    3/2015

OTHER PUBLICATIONS

"International Application Serial No. PCT/US2014/054154, International Search Report mailed Jan. 20, 2015", 6 pgs.

(Continued)

*Primary Examiner* — Brenda Bernardi
(74) *Attorney, Agent, or Firm* — Schwegman Lundberg & Woessner, P.A.

(57) ABSTRACT

A mixing signal processing technique modifies digital audio recordings to simulate the linear and nonlinear effects of propagation and mixing of sounds in air. When multiple sounds or complex sounds comprised of multiple frequencies in the audible spectrum propagate in such a nonlinear medium, they transfer energy into sound at new frequencies given by the sums and differences of the original signal frequencies. The mixing signal processing technique may improve the ability of a system to reproduce the effects of a live performance using a digital audio recording.

14 Claims, 24 Drawing Sheets

Related U.S. Application Data 5, 2013, provisional application No. 61/874,103, filed on Sep. 5, 2013, provisional application No. 61/918,550, filed on Dec. 19, 2013.

(56) References Cited

U.S. PATENT DOCUMENTS

| | | |
|---|---|---|
| 2009/0141911 A1 | 6/2009 | Iwamatsu |
| 2010/0054482 A1 | 3/2010 | Johnston |
| 2011/0243340 A1 | 10/2011 | Kumagai |
| 2015/0063578 A1 | 3/2015 | Daly |
| 2015/0063597 A1 | 3/2015 | Daly |

OTHER PUBLICATIONS

"International Application Serial No. PCT/US2014/054154, Invitation to Pay Additional Fees and Partial Search Report mailed Dec. 5, 2014", 5 pgs.

"International Application Serial No. PCT/US2014/054154, Written Opinion mailed Jan. 20, 2015", 7 pgs.

Dattorro, Jon, "Effect Design (Part I: Reverberator and Ohter Filters)", J. Audio Eng. Soc., vol. 45, No. 9, (Sep. 1997), 660-684.

Meyer, Stefan, et al., "Optimal Regularity and Long-Time Behavior of Solutions for the Westervelt Equation", Applied Mathematics and Optimization, vol. 64, No. 2, (Jun. 1, 2011), 257-271.

"U.S. Appl. No. 14/477,829, Notice of Allowance mailed Jan. 7, 2016", 9 pgs.

"U.S. Appl. No. 14/477,829, Notice of Allowance mailed Apr. 20, 2016", 6 pgs.

"U.S. Appl. No. 14/477,829, PTO Response to Rule 312 Communication mailed Aug. 1, 2016", 2 pgs.

"U.S. Appl. No. 14/477,831, Notice of Allowance mailed Apr. 29, 2016", 9 pgs.

"International Application Serial No. PCT/US2014/054154, International Preliminary Report on Patentability mailed Mar. 17, 2016", 9 pgs.

* cited by examiner

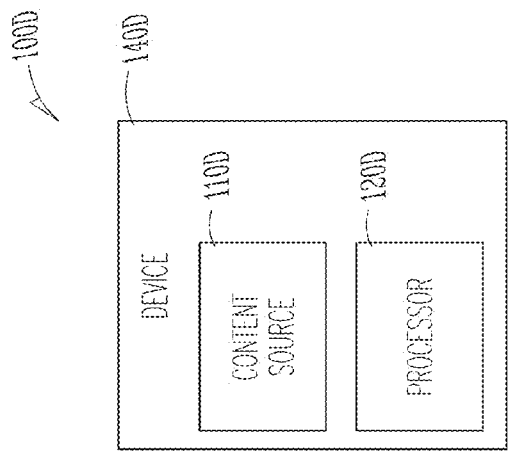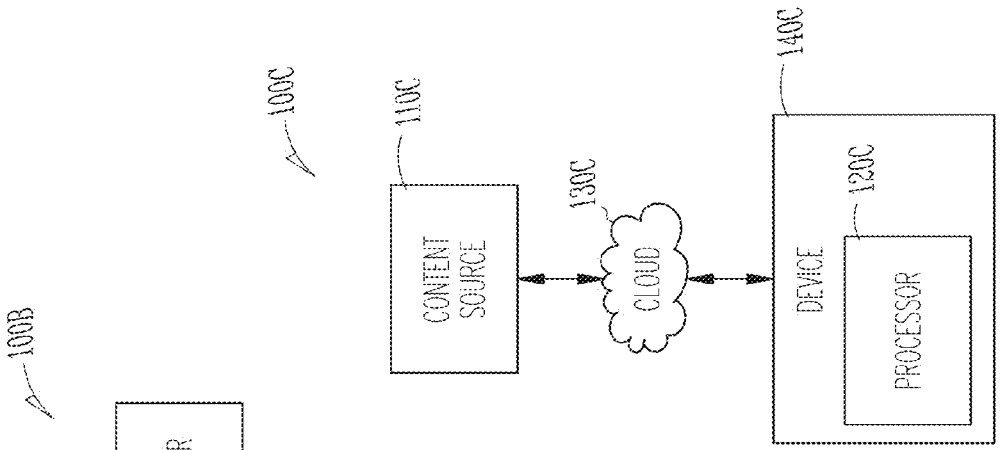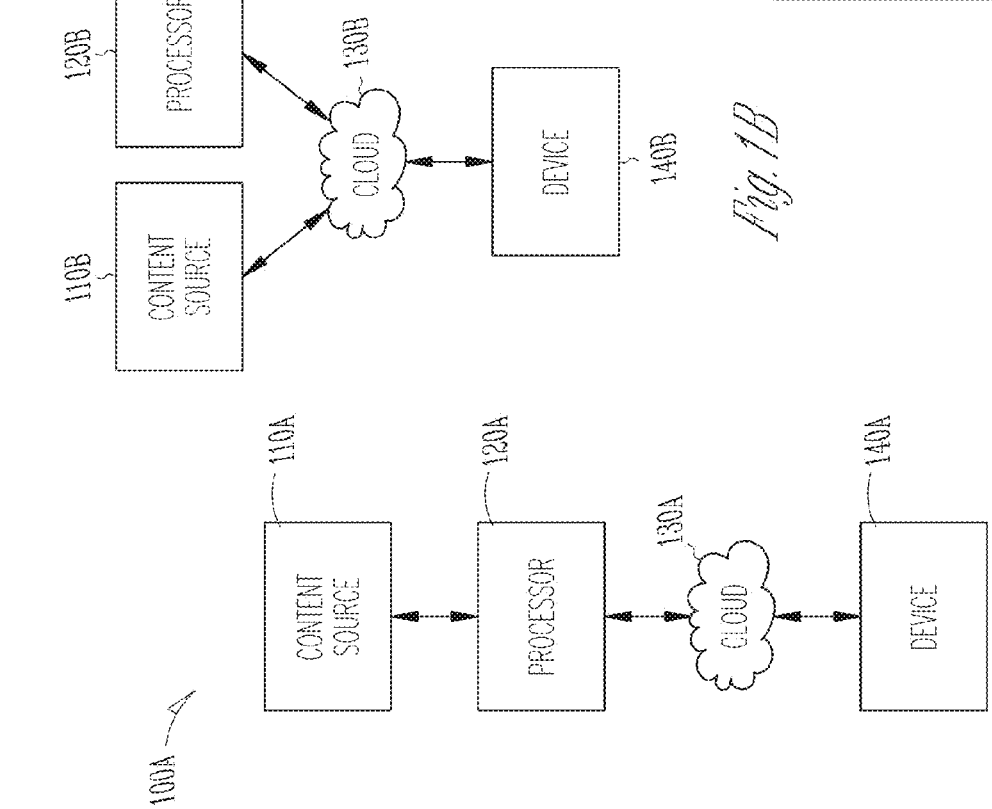

SYSTEMS AND METHODS FOR SIMULATION OF MIXING IN AIR OF RECORDED SOUNDS

CLAIM OF PRIORITY

This application claims the benefit of priority under 35 U.S.C. §119(e) of all of the following patent applications: U.S. Provisional Patent Application No. 61/874,099, filed Sep. 5, 2013; U.S. Provisional Patent Application No. 61/874,120, filed Sep. 5, 2013; U.S. Provisional Patent Application No. 61/874,150, filed Sep. 5, 2013; U.S. Provisional Patent Application No. 61/874,125, filed Sep. 5, 2013; U.S. Provisional Patent Application No. 61/874,137, filed Sep. 5, 2013; U.S. Provisional Patent Application No. 61/874,103, filed Sep. 5, 2013; and U.S. Provisional Patent Application No. 61/918,550, filed Dec. 19, 2013, all of which are incorporated herein by reference in their entirety.

FIELD

The present subject matter relates generally to systems and methods for audio enhancement.

BACKGROUND

Systems that provide audio playback, such as portable flash players, mobile phones, car players, televisions, and home theater receivers, reproduce the stored audio during playback. However, the recorded audio is the result of layers of several different sound sources that are frequently mixed electronically for recording, as opposed to a live recording that is played in the same acoustic environment and mixed acoustically while recording. Such electronic recordings can lack the acoustic attributes of live performance where the sounds are all played together in one sound environment.

These systems frequently feature user selectable manual sound controls for adjusting characteristics of the audio, such as volume, equalization, and dynamic range. These systems require the user to set these controls, often under sub-optimal conditions and with no training. Additionally, these systems may employ a number of different audio transducers for generating audible sound. As a result, the listening experience is often compromised, because the reproduction of the audio need not take into account the type and manufacture of the audio transducer.

What is needed in the art are systems and methods for providing enhanced audio to provide audio reproduction that models a more live performance.

BRIEF SUMMARY

The present subject matter provides various embodiments with systems and methods for enhancing recorded sound. In various approaches, the various embodiments are used individually or in combination with each other. In various approaches, the system is combined or distributed using various processing options.

A mixing signal processing technique modifies digital audio recordings to simulate the linear and nonlinear effects of propagation and mixing of sounds in air. When multiple sounds or complex sounds comprised of multiple frequencies in the audible spectrum propagate in such a nonlinear medium, they transfer energy into sound at new frequencies given by the sums and differences of the original signal frequencies. Second-order nonlinear effects may generate content at levels as high as only 30 decibels below the primary sound field, and are often perceptible during live music performances. The mixing signal processing technique may improve the ability of a system to reproduce the effects of a live performance using a digital audio recording.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

BRIEF DESCRIPTION OF THE DRAWINGS

The accompanying figures illustrate certain embodiments of the subject matter and demonstrate certain aspects of the subject matter discussed in the following detailed description.

FIGS. 1A-D demonstrate systems according to various embodiments of the present subject matter.

DETAILED DESCRIPTIONS OF THE SUBJECT MATTER

Figure 2:
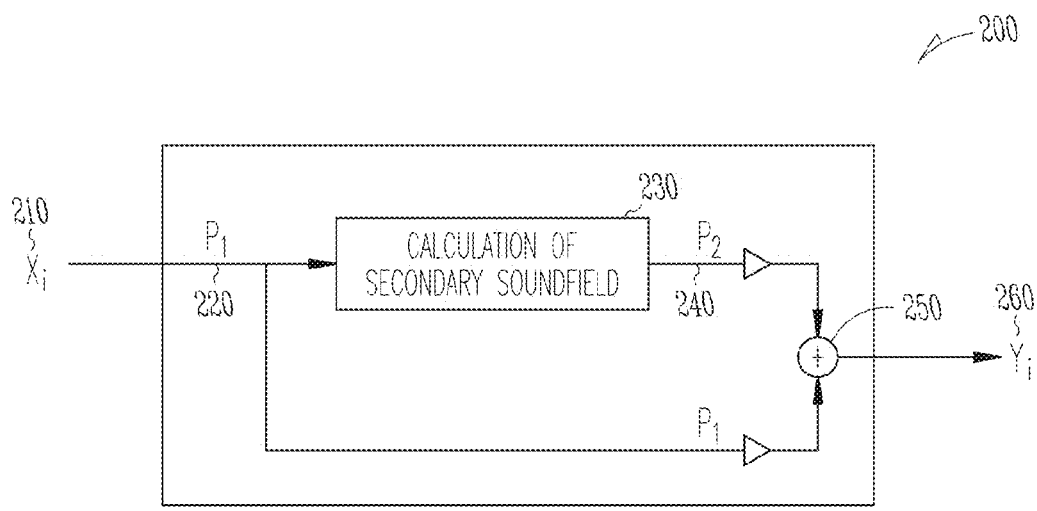
FIG. 2 shows a system for simulating linear and nonlinear effects of propagation and mixing of sound in air according to various embodiments of the present subject matter.

FIGS. 1A-D demonstrate some embodiments of systems 100A-100D according to various embodiments of the present subject matter. FIG. 1A shows a first overall system topology 100A. The system topology 100A may include a content source 110A, such as an analog or digital audio recording or a live digital stream. The content source 110A may provide content to the processor 120A, where the processor 120A may include one or more of the audio enhancement techniques describe below. The processor 120A may provide enhanced audio through a network (e.g., the internet, "the cloud") 130A to the device 140A. The use of a remote content source 110A may provide more storage space than a user smartphone, and the use of a remote processor 120A may provide greater processing power and reduce smartphone power consumption. At the device 140A, the enhanced audio is controlled via user inputs or reproduced using headphones, speakers, or other audio playback hardware or software.

FIG. 1B shows a second overall system topology 100B. The system topology 100B may include a content source 110B, such as an analog or digital audio recording or a live digital stream. The content source 110B may provide audio through a network 130B to the processor 120B, where the processor 120B may include one or more of the audio enhancement techniques describe below. The use of a remote content source 110A may provide more storage space than a user smartphone, and the use of a remote processor 120A may provide greater processing power and reduce smartphone power consumption. The processor 120B may provide enhanced audio through the network 130B to the device 140B for playback.

FIG. 1C shows a third overall system topology 100C. The system topology 100C may include a content source 110C, such as an analog or digital audio recording or a live digital stream. The content source 110C may provide audio through a network 130C to device 140C, where device 140C includes processor 120C. For example, the content source 110A could be an internet-based music streaming service, which may stream audio data to a user's smartphone, where the smartphone includes the processor 120A and the device 140.

FIG. 1D shows a fourth overall system topology 100D. The system topology 100D may include a content source 110D, such as an analog or digital audio recording or a live digital stream. The content source 110D may provide audio to device 140D, where device 140D includes processor 120D. The use of a local content source 110D may allow a user to use one or more of the audio enhancement techniques describe below without needing a network connection.

The combination of the content source 110A-D, processor 120A-D, network 130A-D, and device 140A-D may enhance audio reproduction using one or more of the audio enhancement techniques describe below.

Digital Audio Processing to Simulate the Nonlinear Properties of Sound Propagation and Mixing in Air The experience of listening to digital audio recordings is improved by making subtle modifications to the recorded audio signals that simulate the linear and nonlinear effects of propagation and mixing of sound in air. The mixing in a nonlinear medium of multiple or complex sound waves comprised of multiple frequencies is known as heterodyning. Heterodyning may occur at various locations in the air, including at a speaker or at the user's tympanic membrane. Because the speed of sound in air is itself dependent upon the particle velocity or pressure of the air at any given moment in time and position in space, air may not be a purely linear propagation medium. For example, the compression peaks of an acoustic waveform may travel faster than rarefaction troughs, distorting the waveform and transferring energy into higher harmonics of the original signal. When multiple or complex sound waves comprised of multiple frequencies propagate in such a nonlinear medium, the sound waves transfer energy into sound at new frequencies (e.g., intermodulation products) given by the sums and differences of the original signal frequencies.

While these nonlinear effects of air are generally subtle at auditory frequencies and typical sound pressure levels (SPLs) (e.g., loudness levels), second-order nonlinear effects may generate content at levels as high as only 30 decibels below the primary sound pressure and are often perceptible during live music performances. These second-order intermodulation products have amplitudes proportional to a derivative of the products, which may result in intermodulation products or other propagation effects that increase with an increase in frequency. Nonlinear propagation effects of audible frequencies may also interact with lower frequencies in an intermodulation scheme. Thus, the nonlinear effects of air may play an appreciable role in how the brain processes and perceives sound. The mixing signal processing technique may improve the ability of a system to reproduce the effects of a live performance using a digital audio recording.

While some music is experienced through live performance, most music is experienced through listening to stored analog or digital audio signals. Digital audio signals are converted to analog signals using digital-to-analog converters, and the original or converted analog audio signals are reproduced acoustically by headphones, open-air loudspeakers, or other means. The reproduced signals may contain unnatural content, as the reproduced signals represent recorded or synthesized waveforms that have not propagated through air or otherwise mixed in ways that are naturally encountered with live sound. For example, many genres of music may use recording techniques known as "close-mic'ing" and "overdubbing," often in combination. These techniques may include minimal amounts of propagation and mixing in air, and may result in sterile recordings of sounds.

In close-mic'ing, microphones are placed in close proximity to the sound source. Close-mic'ing can be used to capture direct sounds, while simultaneously reducing energy captured from other sound sources and reducing acoustic reflections occurring in the room where the recording is taking place. In contrast to listening to live music at a range from 1 meter to tens of meters, close-mic'ing sound-source-to-microphone distances may range from about 10 centimeters for recording vocalists to 5 centimeters for recording amplified guitar or acoustic drums. In each case, the recorded sound waveform may experience extremely little propagation in air, and therefore may not include effects generated by propagation associated with a similar sound source heard from a more natural listening distance. When multiple musicians are recorded performing in a space at the same time, close-mic'ing may enable a mix engineer to control their relative volumes individually or apply special processing to a subset of performers. While this isolation of sounds is useful during mixing, natural effects of nonlinear propagation and mixing in air evolve gradually over distance and may require up to tens of meters of propagation to fully develop, and close-mic'd recordings may fail to capture these natural effects of nonlinear propagation and mixing in air.

The recording technique of overdubbing may isolate individual sounds more than close-mic'ing, and may also fail to capture natural effects of nonlinear propagation and mixing in air. In overdubbing, additional sounds are recorded and synchronized with previously recorded sounds in order to build a recording of a full ensemble or song gradually through summation of multiple individual recordings. Because modern digital audio workstations make it easy to layer a large number of individual recordings, each instrument or performance that contributes to a song is recorded individually. For example, performers may play an instrument while listening to previously recorded parts of the song or a timing cue (e.g., metronome), and may record each instrument or vocal component individually until every song component has been recorded. These individually recorded song components may also be close-mic'd to avoid room reflections and capture an isolated audio recording (e.g., dry sound).

Through heavy use of these techniques, many modern recordings include numerous individual close-mic'd waveforms that are mathematically added together by a computer and have not propagated and mixed in air as they typically would have in a natural live performance. In particular, digital audio waveforms that have been generated electronically or synthesized digitally may not have experienced any propagation or mixing in air. These digital audio waveforms are an extreme example of modern recording practices, as they are completely isolated from the other sounds contributing to a song or sound mixture, and may include little or no additional content or imprint from the space in which they were recorded.

Furthermore, when these sounds are later reproduced acoustically, it is often in a setting that does not allow for the propagation distance or source SPL (sound pressure level) needed for the generated sound to experience the amount of nonlinear propagation normally incurred during live performances or large-scale concerts. This is true for many home and car playback systems and listening environments, and is particularly relevant to headphones and earphones. For example, headphone propagation distance of reproduced sound can be less than 6 millimeters, which may allow a recorded sound to propagate in air for 5 to 10 centimeters from source to microphone and then earphone to the tympanic membrane. Additionally, headphones may use a lower source SPL, as little spreading or propagation loss occurs.

Because modern recording techniques and common listening settings reduce or eliminate nonlinear propagation effects often present and audible during live performances, it is beneficial to recreate these effects through digital signal processing so a more natural sound is provided by digital recordings in typical listening environments. The acoustical sidebands created by sound heterodyning in air give an added spectral and harmonic richness to sound that is commonly absent from the modern listening experience and would be beneficial to reproduce digitally. Additionally, it is desirable to impose some of the frequency-dependent attenuation that accompanies natural propagation of sound in air to restore a more natural tonal balance to close-mic'd recordings, and to improve simulation of nonlinear interactions between or among sound components as they propagate.

Beyond compensating for modern recording techniques and playback settings, the use of digital signal processing to simulate nonlinear propagation and mixing of sound in air may enhance the experience of listening to digital audio. The nonlinearity of air is most pronounced when high sound pressure levels are present, and listeners often find that higher listening volumes provide a more compelling and immersive listening experience. Digitally introducing the nonlinear effects that would have occurred at high playback volumes may make playback at lower volumes more exciting and enjoyable by simulating part of the experience of listening at high SPLs.

FIG. 2 shows a system 200 for simulating linear and nonlinear effects of propagation and mixing of sound in air according to various embodiments of the present subject matter. System 200 may operate on one or more input signals in order to generate intermodulation products that would be generated naturally during acoustic propagation of one or more signals at a given peak sound pressure level and then mixing these products with the original input signal(s). Additional linear filtering is imposed by the system before, during, or after this process in order to simulate the natural frequency-dependent attenuation of sound as it propagates through air. System 200 may improve the listening experience by compensating for modern digital recording techniques and listening settings that reduce or eliminate the natural attenuation and nonlinear effects of sound propagation through air and by simulating high SPL playback of audio at lower volumes by introducing the nonlinear effects of sound propagation at high SPLs into the recorded waveform itself. System 200 modifies source material in a transparent and potentially subtle way while not altering the creative content of processed recordings, making it suitable for application to all varieties of musical or audio content recorded and stored in digital form.

System 200 takes as its input one or more input signals $(X_i)$ 210 that represent the amplitude of one or more audio waveforms over time. In various embodiments, these input signals 210 are a series of digitally stored values representing the instantaneous amplitude of a band-limited waveform that has been sampled at regularly spaced moments in time. Each input signal $(X_i)$ 210 may have a corresponding primary sound pressure $(P_1)$ 220. The primary sound pressure 220 is provided to a processor 230 for calculation of a secondary soundfield. Processor 230 is a general purpose processor, a dedicated digital signal processing (DSP) integrated circuit (IC), or another type of processor suitable for the calculation of the secondary soundfield. The output of processor 230 includes a secondary sound pressure ($P_2$) 240, where the secondary signal 240 may simulate effects that would have occurred at high playback volumes to simulate a live mixing of the various sounds.

Primary and secondary sound pressures 220 and 240 are combined through superposition within an adder 250. Adder 250 includes a digital adder circuit or a summing amplifier and may include additional summation or timing components. For example, processor 230 may introduce a delay in the secondary signal 240 relative to the primary signal 220, and adder 250 may include a fixed time delay or a synchronization module to detect the delay of the secondary signal 240. Adder 250 may combine primary and secondary sound pressures 220 and 240 to provide a sound pressure output signal ($Y_i$) 260, where output signal 260 may simulate what the listener would hear at a live event.

System 200 may modify the input signal(s) in a manner dependent upon one or more controlling parameters. Generally, these parameters define physical attributes of the simulated sound propagation and mixing and thus directly influence the formulas used to calculate the intermodulation products generated by the nonlinearity of air. Alternatively, higher-level parameters are used to control the overall character or extent of the processing. In some embodiments of the subject matter, these parameters are determined automatically through an additional mathematical analysis of the input's auditory content and the application of a rule or decision system that links analyzed signal content parameters to control parameters.

Because digital audio signals generally contain complex waveforms comprised of multiple frequency components and are applied during the mixing of multiple recorded sounds, the present subject matter in various embodiments uses quasi-linear solutions of Westervelt's general inhomogeneous wave equation to determine the relationship between input signals and generated intermodulation products. In one embodiment of the subject matter, the Westervelt equation for second-order mixing, $$\nabla^2 P_2 - \frac{1}{c_0^2} \frac{\partial^2 P_2}{\partial t^2} = -\rho_0 \frac{\partial q}{\partial t}, \tag{1}$$

is used to capture the second-order intermodulation products generated by the nonlinearity of air, as these are generally the most prominent of intermodulation products. In equation (1), secondary sound pressure ($P_2$) 240 is the pressure variation associated with the intermodulation products generated by the nonlinearity of air, ($\rho_0$) and ($c_0$) represent the density and small-signal sound speed of air, respectively, and (q) is the virtual source density given by $$q = \frac{\beta}{\rho_0^2 c_0^4} \frac{\partial}{\partial t} P_1^2, \tag{2}$$

which is proportional to the time derivative of the square of the primary sound pressure ($P_1$) 220. Here, $\beta$ represents the second-order nonlinear coefficient of air, which may vary with the interaction angle of component sound fields if the primary sound pressure may be a mixture. The general solution to differential equation (2), which can be used by one embodiment of the presently disclosed subject matter, is $$P_2 = -\frac{\rho_0}{4\pi} \int_V \frac{\partial q}{\partial t} \frac{e^{ik_s r'}}{r'} dV, \tag{3}$$

where ($k_s$) is the wavenumber corresponding to an intermodulation product, (V) is the interaction volume over which the primary sound pressure has sufficient amplitude to contribute to the generation of intermodulation products, and (r') is the distance from each virtual source point in the interaction volume (V) to the location where the generated secondary field is observed.

In this exemplary embodiment, the primary sound pressure ($P_1$) 220 is comprised of either the single input signal ($X_i$) 210 or a combination of M individual input signals ($X_i$) 210, where i=1, . . . , M. Parameters of equation (3) such as the definition of the interaction volume V, the radiation pattern of the sources (if multiple inputs may be being mixed), and the physical sound pressure level being simulated is specified, either directly by a user, based on higher-level specifications, or by some other means, and a solution for the secondary sound field $P_2$ is calculated. An interaction volume (V) with a single isotropic source is shown in FIG. 3, and an interaction volume (V) with two isotropic sources is shown in FIG. 4.

Figure 3:
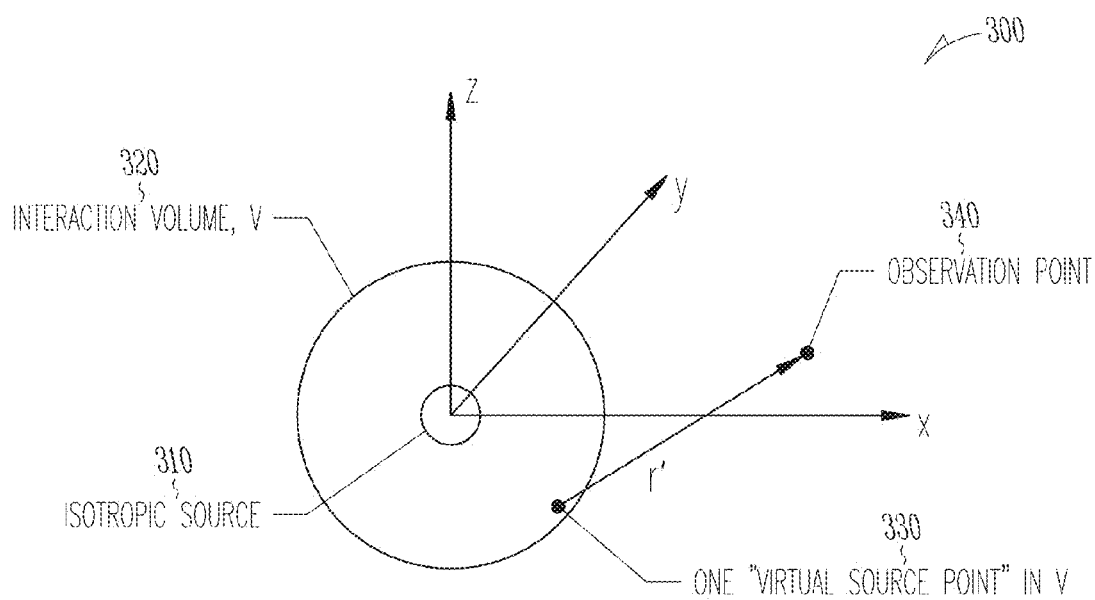
FIG. 3 demonstrates a single-source spatial representation of an interaction volume, according to one embodiment of the present subject matter.

FIG. 3 demonstrates a single-source spatial representation 300 of an interaction volume, according to one embodiment of the present subject matter. In particular, FIG. 3 demonstrates calculation of the secondary sound pressure ($P_2$) 240 generated by a complex (multiple-frequency) primary sound pressure ($P_1$) 220 radiating from a single isotropic source due to the nonlinear effects of propagation in air. The single-source representation 300 may include a single isotropic source 310, where the isotropic source 310 represents sound generated using primary sound pressure ($P_1$) 220. The isotropic source 310 may generate an interaction volume (V) 320 as used in equation (3), where interaction volume 320 is the volume over which the primary sound pressure contributes to the generation of intermodulation products. A virtual source point 330 is selected, where the virtual source density at virtual source point 330 corresponds to virtual source point (q) in equation (2). An observation point 340 is selected, where the distance from virtual source point 330 in the interaction volume (V) 320 to observation point 340 corresponds to the distance (r') in equation (3).

Figure 4:
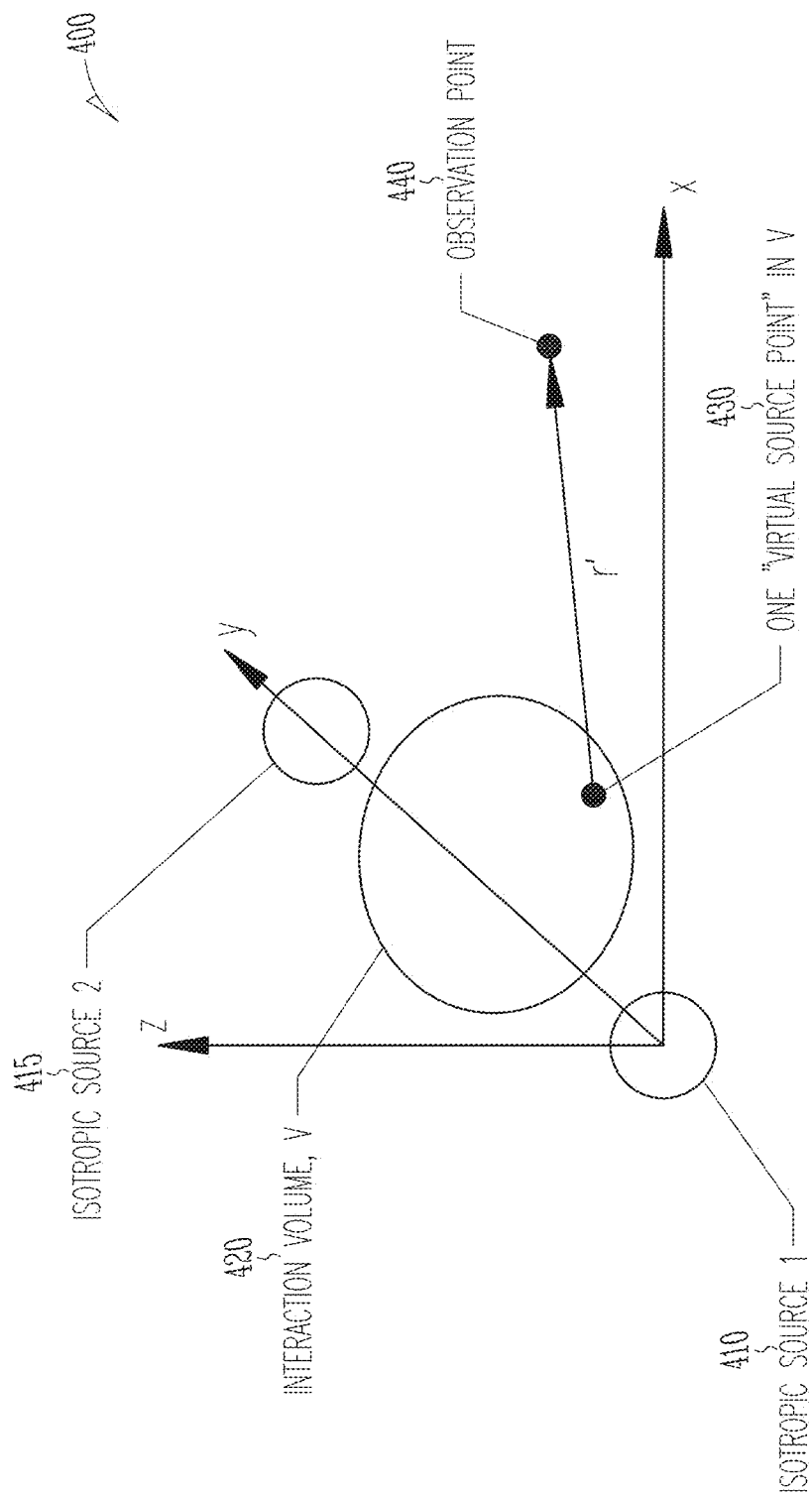
FIG. 4 demonstrates a dual-source spatial representation of an interaction volume, according to one embodiment of the present subject matter.

FIG. 4 demonstrates a dual-source spatial representation 400 of an interaction volume, according to one embodiment of the present subject matter. In particular, FIG. 4 demonstrates one method of calculating secondary sound pressure ($P_2$) 240 due to the nonlinear effects of propagation in air, where the secondary sound pressure ($P_2$) 240 can be generated by mixing of two independent isotropic sources. The single-source representation 400 may include a first isotropic source 410 and a second isotropic source 415. The first and second isotropic sources 410 and 415 may be generated using primary sound pressure ($P_1$) 220. The isotropic source 410 may generate an interaction volume (V) 420 as used in equation (3), where interaction volume 420 may be the volume over which the primary sound pressure contributes to the generation of intermodulation products. A virtual source point 430 may be selected, where the virtual source density at virtual source point 430 corresponds to virtual source point (q) in equation (2). An observation point 440 may be selected, where the distance from virtual source point 430 in the interaction volume (V) 420 to observation point 440 corresponds to the distance (r') in equation (3).

For the interaction volume (V) shown in FIG. 3 and FIG. 4, the sound field may be comprised of the sum of second-order intermodulation products. The sound fields represent sums and differences between pairs of frequencies present in the input signals. The sound fields also represent second harmonics of all frequencies present in the input signals, each with amplitudes that may be proportional to the square of their frequencies.

Whether using one, two, or more isotropic sources, sound pressure output signal ($Y_t$) 260 may be formed by mixing the secondary sound field ($P_2$) 240 with input primary sound pressure ($P_1$) 220 to arrive at the total sound field that would be observed in air. The naturally occurring relative amplitudes of the primary and secondary sound fields 220 and 240 may be given by the solution to equation (1). The sound pressure output signal ($Y_t$) 260 may be further controlled by additional parameters, either interactively by a user, automatically according to analysis of the input signals 210, or by other means.

Linear filtering may be used to simulate frequency-dependent attenuation of sound as it propagates through air. Linear filtering may be applied to the input signals 210 before or after calculating output signal 260, depending on computational considerations and other design choices. Characteristics of such linear filtering may be selected to simulate or reduce attenuation properties of air.

The presentl subject matter applies the Westervelt equation to audible frequencies to compensate directly for modern recording techniques or simulate accurately the effects of high SPL playback of digitally recorded audio to enhance the listening experience. Typical uses of the Westervelt equation deal with ultrasonic sound. Most applications, such as high-intensity focused ultrasound and industrial applications of ultrasound, such as cleaning and welding, may be very different from that of the presently disclosed subject matter. The Westervelt equation has been used in the field of parametric acoustic arrays, such as in the analysis and design of systems that generate beams of ultrasonic sound in order to produce directionally controllable content at audio frequencies through the nonlinear interactions of these ultrasonic beams in air. Because the nonlinear effects of air increase with frequency, these effects may be strongly present at ultrasonic frequencies, but may be subtle at audio frequencies. As a result, mathematical application of these nonlinearities to date has focused on ultrasonic applications, and not on digital audio waveforms with content only in the auditory band for enhancing listening during playback.

Additional methods may be used to simulate intermodulation products generated by audio-band sound due to the nonlinearity of air. A reduced solution may include second-order effects and intentionally exclude higher-order intermodulation products. Because of the generally low amplitudes of higher-order intermodulation products generated at reasonable SPLs at audible frequencies, the second-order embodiment discussed above may be sufficient to achieve the desired results, however other embodiments are possible. In some cases, particularly when simulating very high source SPLs or when input waveforms have particular spectral properties, the calculation of higher-order intermodulation products may be desirable. Higher-order calculations may be included in an embodiment of the subject matter if deemed necessary by a user or through analysis of the input signal.

Digital Signal Processing of Priming Signal for Reduction of Stress in the Auditory System A priming signal processing technique modifies digital audio recordings to reduce the stress experienced by a listener's auditory system. A priming signal may reduce the instantaneous stress experienced by the auditory system during sudden changes in signal energy. The priming signal may be generated such that pre-signal priming additions may not result in obvious differences in perceived sounds, thereby leveraging temporal auditory masking.

A method for processing digital audio signals in order to decrease the stress experienced by the auditory system of a listener without overtly changing the creative or musical content of the signal may be disclosed. The method consists of an adaptive, time-varying system that responds to characteristics of input signal content according to a rule system, and that alters the signal either by mathematical convolution with one or more response templates or by the momentary addition of noise-like signals.

Unlike existing audio processing techniques, this method may not be intended to generate obvious audible differences in the content of an audio signal, but rather to cause an appreciable difference in the comfort and enjoyment of the listener by conditioning the signal to interact more gently or naturally with the listener's auditory system. This method may be designed to compensate either directly or indirectly for the deleterious effects of unnaturally synthesized, mixed, or recorded digital audio signals as well as other potential shortcomings of digital audio formats and reproduction. Due to its ease of implementation, this method may be suitable for application to all varieties of musical or audio content recorded and stored in digital form.

Synthetic generation of acoustic waveforms provides extensive creative opportunities. However, synthetic waveforms also present the listener with audio material that defies many properties of natural sound. Because these synthetic waveforms do not adhere to physical laws that the auditory system may be designed to understand, this defiance may cause stress on the human auditory system in processing and interpreting these signals. While the creative freedom afforded by these signals should not be diminished, it may be desirable to introduce processing that may compensate for differences between expected and experienced characteristics of sound. Such compensation may allow creation of a more enjoyable listening experience without significantly altering the creative content of the audio. Furthermore, it may be generally desirable to process audio signals in ways that reduce the stress experienced by a listener's auditory system, whether or not such stress reduction may be achieved by imitating the natural behavior of sound.

There may be many known phenomena in the human auditory system that may be relevant to the present discussion. At a high level, humans may be able to derive much information about their surroundings from analyses of patterns of reflections or multiple arrivals of the same acoustic signal. For example, the auditory system may be able to use the filtering and delay imposed by the shape of the human head and ears (e.g., head-related transfer functions) to determine the direction from which a sound originated. Reflections of a sound arriving after the initial direct path may be used by the auditory system to understand characteristics of the space surrounding a listener such as whether or not it may be enclosed, how distant nearby walls or other solid or semi-solid surfaces (such as groves of trees) might be, and the types of materials present in the surroundings (hard and reflective or soft and absorbent). Such reflections can also be used to understand the location of a sound source relative to the listener: the pattern of reflections that arrives at a listener varies with changes in the relative locations of the listener and the source, creating auditory cues for distance and obscuration.

All of this high-level auditory information may be derived instinctually, without conscious training or attention, and may be based on the auditory system's understanding of how sound naturally interacts with its environment. The majority of cues for this understanding may be contained in filtering and arrival patterns during the first 100 milliseconds or so after a direct signal, and our ability to make sense of these cues indicates a specialization of the human auditory system for processing naturally occurring audio signals.

At a lower level, it may be known that a wide range of similar acoustic signals may be perceived to present the same sound. Although the human auditory system may be complex and not fully understood, this phenomenon has been studied extensively and may be known as auditory masking: the process by which the presence of one sound can render another sound imperceptible. This effect may be a result of both the mechanics of the human peripheral auditory system, which transduces acoustic energy into electrical neural activity, and higher level processing performed in the central auditory system. Acoustic energy may be transduced into neural activity in the cochlea by inner hair cells, which release neurotransmitters in response to mechanical deflection and incite action potentials (e.g., electrical spikes) in the primary auditory neurons. Various encoding schemes, such as first-spike latency, rate-based coding, and detailed temporal codes may be then employed by the auditory system to transmit and analyze these initial excitations. Stated simply, if a dominant sound may be already exciting a particular group of neurons, it may prevent a weaker sound that would excite the same neurons from being perceived. This may be known as simultaneous masking. Additionally, because much of the processing performed by the central auditory system involves integration of neural spike signals over some duration of time and because the human auditory system may temporarily decrease its sensitivity to sound in reaction to loud stimuli, masking can extend over a duration of time: a loud sound may render quieter sounds immediately preceding it or immediately following it imperceptible, with an influence that extends longer afterward than before (approximately 20 milliseconds before and 100 milliseconds after a loud sound, with influence decaying exponentially away from the time of the sound). This may be known as temporal masking. Finally, because each point along the length of the cochlea may be tuned to a specific frequency, sounds that may be similar in frequency may primarily excite the same groups of neurons, and may be more likely to mask one another through either type of masking.

This phenomenon of auditory masking means that it may be possible to make significant modifications to an audio signal which do in fact present the human auditory system with a different stimulus but which do not yield obvious differences in the content of the signal. This may be the principle that underlies lossy compression schemes for digital audio such as the ubiquitous .mp3 standard, which may be designed to throw away a large portion of the information contained in an audio signal without changing the way that it sounds to a listener. Here, this principle may be exploited to apply processing which has an appreciable effect on the listening experience without obviously altering the auditory system's interpretation of the processed data.

The present system analyzes and modifies this input signal; the exact modification performed on the signal at any given time may be dependent upon the current analysis output, and may vary with momentary changes in characteristics of the input signal. In various embodiments, two main methods of modifying the input signal may be employed. One of these methods may be to modify the input signal by performing the mathematical operation of convolution using the input signal and one or more convolution template signals. The other method may be to introduce additional, momentary noise-like components into the output signal.

Figure 5:
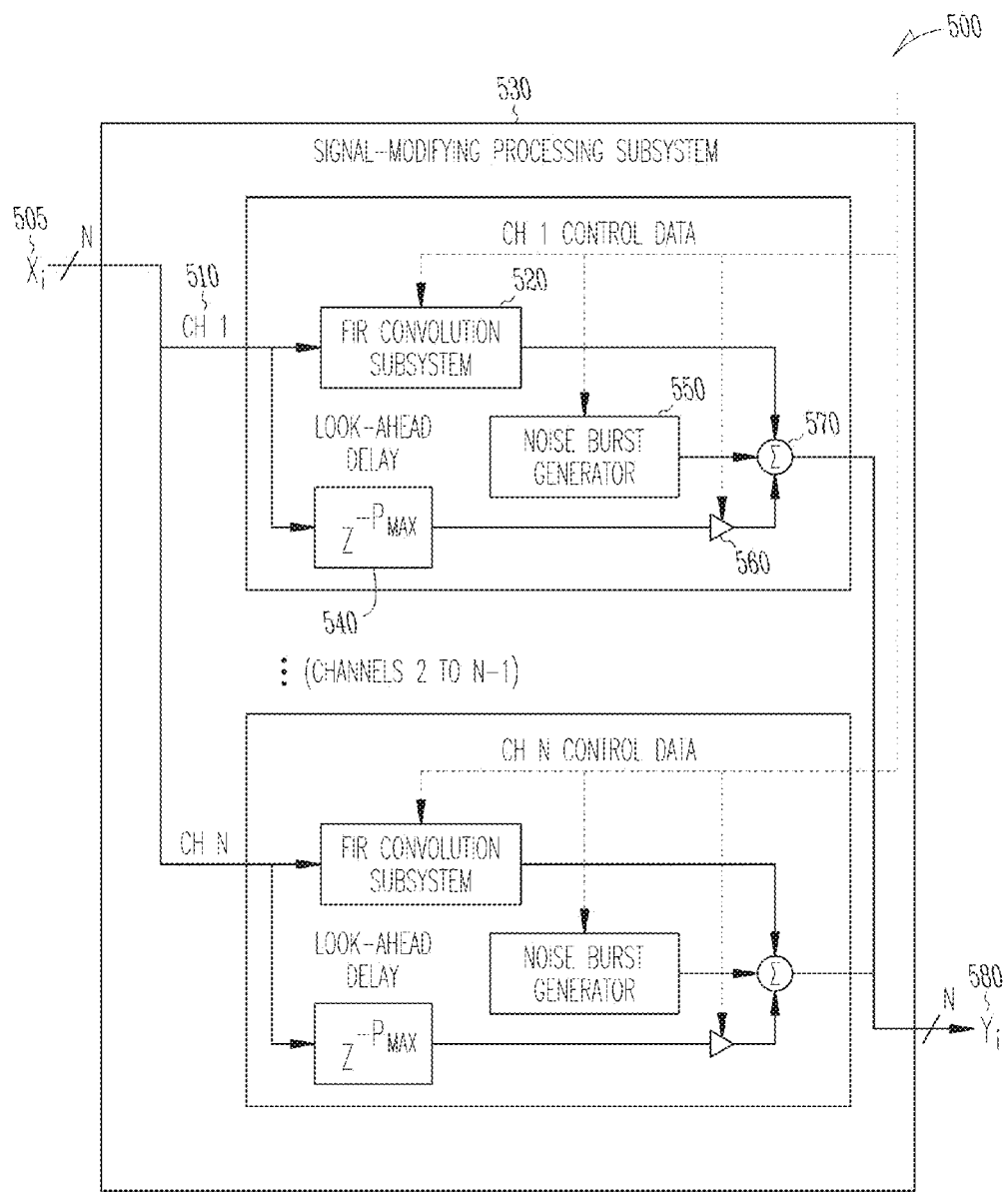
FIG. 5 demonstrates a signal-modification processing subsystem for introduction of a priming signal according to various embodiments of the present subject matter.

Digital Signal Processing of Priming Signal: Methods of Modifying the Input Signal FIG. 5 illustrates an embodiment of a signal-modification processing subsystem 500 for introduction of a priming signal, according to various embodiments of the present subject matter. Subsystem 500 may take multiple input audio channels ($X_i$) as input 505, where input 505 represents the amplitude of an audio waveform over time. In various embodiments, input 505 may be a series of digitally stored values representing the instantaneous amplitude of a band-limited waveform that has been sampled at regularly spaced moments in time. Subsystem 500 may act on each channel of audio individually in series or in parallel. For example, input channel one signal 510 may be directed into an FIR convolution subsystem 520.

Figure 6:
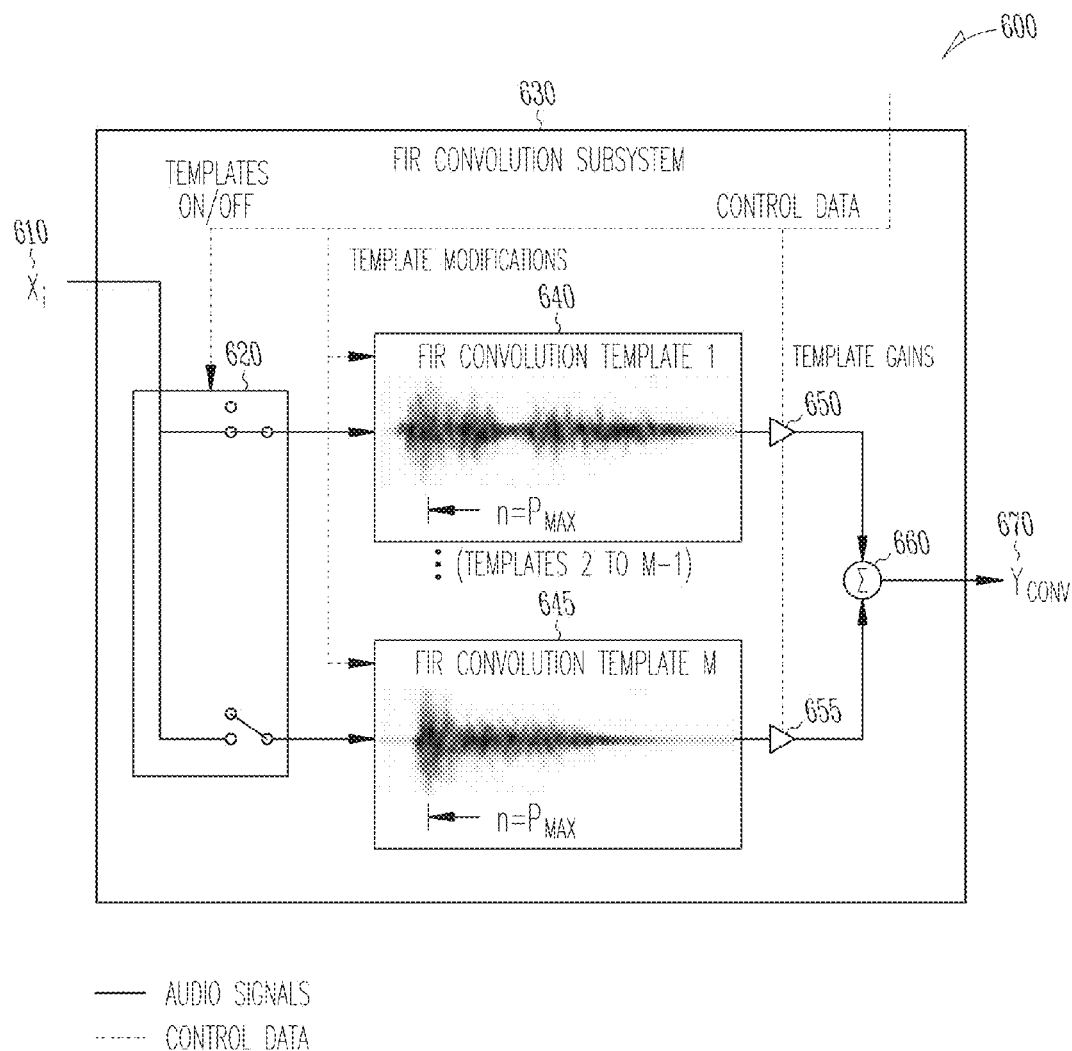
FIG. 6 demonstrates an FIR convolution sub-system according to various embodiments of the present subject matter.

FIR convolution subsystem 520 may convolve the input channel one signal 510 with a convolution template to generate a corresponding priming signal, where the selection of the convolution template may be controlled by control data 530 as discussed in more detail with respect to FIG. 6. Input channel one signal 510 may also be directed into a look-ahead delay 540, where look-ahead delay 540 may delay the input signal by the maximum pre-signal convolution response time, effectively achieving look-ahead into the future of the input signal so that priming signal content may be added just prior to audio transients or other events. Control data 530 may provide control inputs to a look-ahead amplifier 560, which may amplify or attenuate the signal from the look-ahead delay 540. Subsystem 500 may also include a noise burst generator 550 to contribute noise to the priming signal, where the noise burst generator 550 may be controlled using control data 530. The output of the FIR convolution subsystem 520, the noise burst generator 550, and the look-ahead amplifier 560 may be summed in signal adder 570 to form an output signal for channel one. Subsystem 500 may provide an output signal ($Y_i$) 580, where the output signal ($Y_i$) 580 may include an output corresponding to each input audio channel ($X_i$) 505.

Figure 11:
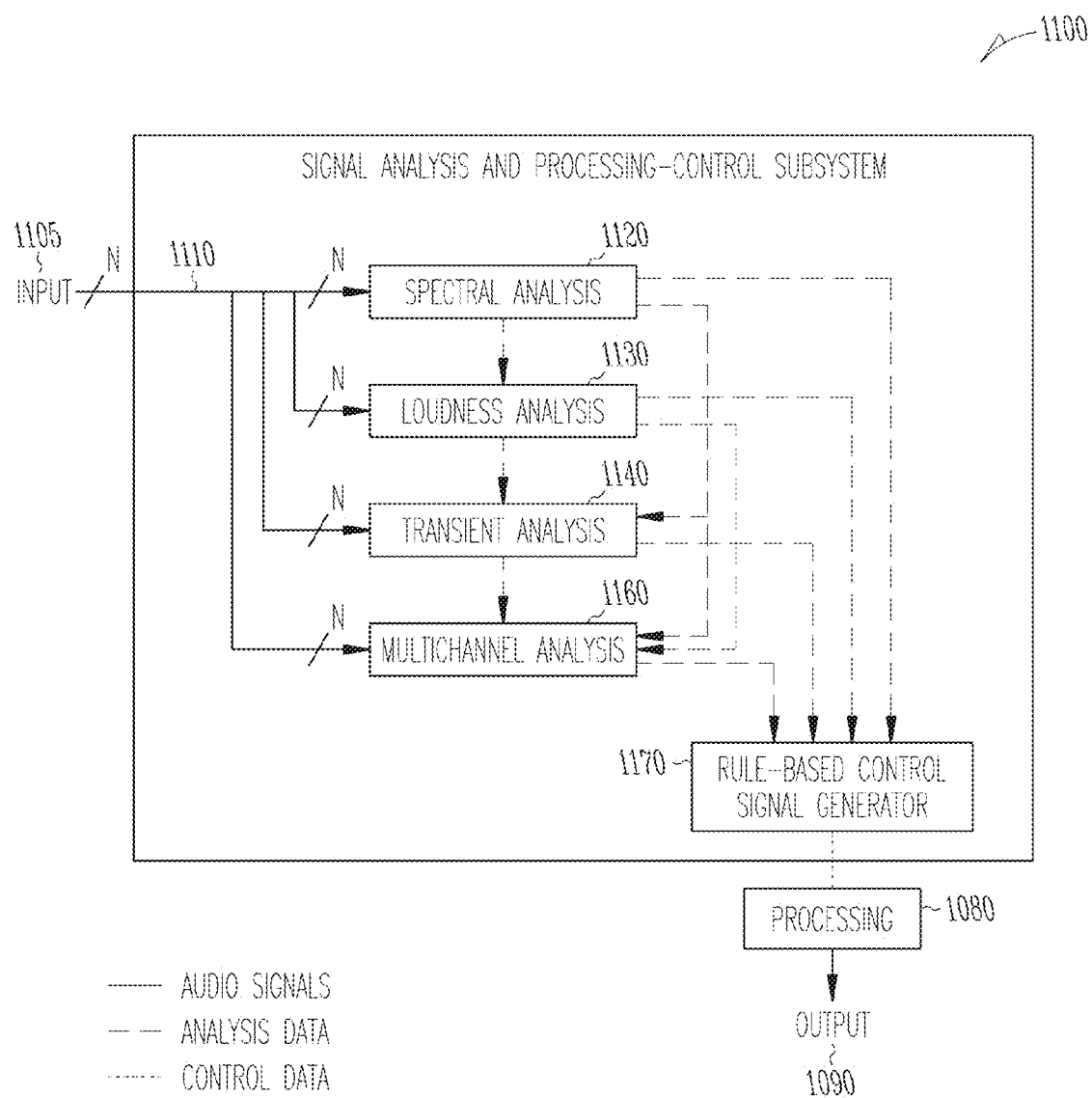
FIG. 11 demonstrates a parallel single-channel analysis systems signal-analysis subsystem according to various embodiments of the present subject matter.
Figure 16:
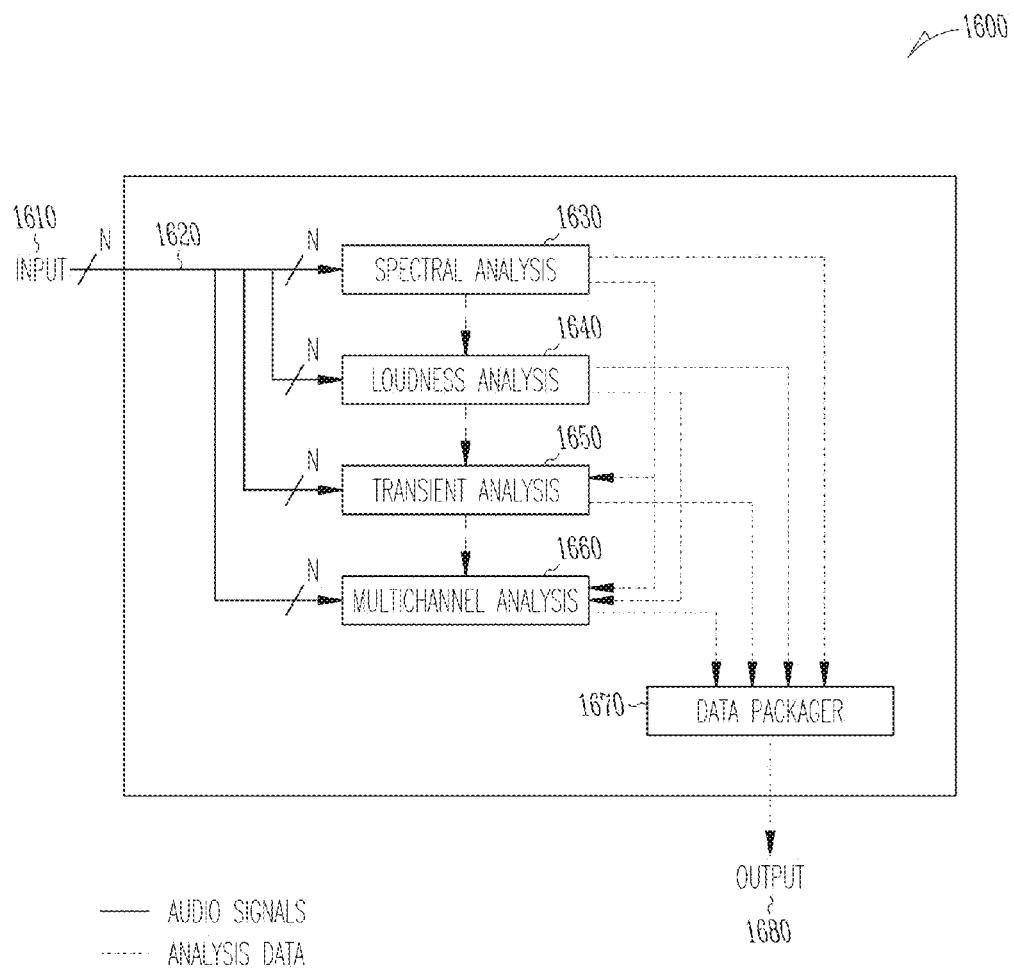
FIG. 16 shows a multiplexed convolution signal analysis processing subsystem according to various embodiments of the present subject matter.

Subsystem 500 may be implemented in various configurations, including the configuration shown in FIG. 11 or 16. In the embodiment illustrated in FIG. 11, multiple audio channels may be analyzed individually by parallel single-channel analysis systems, the output of which may be further processed by a higher-level multi-channel analysis system that may lead to modifications of the resulting single-channel control decisions. In the embodiment illustrated in FIG. 16, each type of signal analysis may be performed on a multichannel collection of signals at once, and the results from each type of analysis may inform other analyses.

FIG. 6 illustrates an embodiment of an FIR convolution subsystem 600, according to various embodiments of the present subject matter. FIR convolution subsystem 600 may take an audio channels ($X_i$) as input 610. Audio input 610 may be fed into a convolution selector 620, and input control data 630 may cause one or more connections to be opened or closed between the audio input 610 and FIR convolution templates 640 and 645. Each of convolution templates 640 and 645 may be modified using input control data 630, such as selecting modifying or replacing the convolution function within each of convolution templates 640 and 645. Though two convolution templates 640 and 645 are shown, any number of convolution templates may be used, and may be selected using any number of switches within the convolution selector 620. For example, a single convolution template may be used, or all convolution templates may be used simultaneously.

Modification of the input signal through calculation of mathematical convolution results may be performed as follows. A number of template signals may be stored as representations of signal amplitude over time. These representations may be digitally stored lists of numbers. These template signals may be derived from recordings of real-world natural environments, pre-constructed mathematically or otherwise, or derived from parametric specifications, and need not be more than approximately 50 milliseconds in length. At any given time, one or more of the M template signals, $c_i$, $i=1, \ldots, M$, may be convolved with the input signal depending on the current input signal analysis results, to generate a set of convolution outputs $y_i$, $$y_i[n] = (x * c_i)[n] = \sum_{k=0}^{N-1} x[n-k]c_i[k], \quad (4)$$

where the convolution template signals, $c_i[n]$, may be defined for the time period $n=0, \ldots, N-1$. Each output of convolution templates 640 and 645 may be fed into corresponding convolution amplifiers 650 and 655, where they may be scaled by gains, $(a_i)$, $i=1, \ldots, M$. Gains $(a_i)$ may be specified by amplifier input control data 630, where amplifier gains may be selected based on the input signal analysis results. The output of convolution amplifiers 650 and 655 may be summed within a signal adder 660 to generate the convolution subsystem output 670, given as $$y_{conv}[n] = \sum_{i=1}^{M} a_i y_i[n]. \quad (5)$$

The output of the signal adder 660 may provide FIR convolution subsystem output 670, which may be summed with additional input channels at signal adder 570 shown in FIG. 5.

In many existing systems using convolution operation in digital audio signal processing, these convolution templates are intended to achieve a particular frequency response specified by a user or to alter the perceived timbre, character, musical or creative content of the input signal. Similarly, in such existing systems, these convolution templates are intended to recreate the full response of any particular linear system or type of linear system such as a real or synthetic acoustic space, or an electrical or acoustic device or instrument. In contrast, in various embodiments of the present subject matter, the convolution templates are designed to reduce stress on the auditory system of a listener without obviously altering the content of the input signal. This design goal, and the goals of subtleness and transparency it entails, therefore distinguishes from the design goals of existing audio processing systems.

Additional content may be introduced prior to transients or other triggering events in the input signal by utilizing digital delay to effectively achieve look-ahead into the future of the input signal and applying convolution templates that include pre-signal content. For example, with a maximum pre-signal response time of $t_{pMAX}$, the path by which the input signal (x) reaches the output without modification may have an imposed delay of $pMAX = \text{ceil}(t_{pMAX} \cdot f_s)$, where (t) denotes the (currently assumed to be regular) sampling frequency of the data contained in (x) and the ceil( ) function denotes rounding up to the next integer value. Delaying the dry path in this way has the effect of equivalently performing the convolutions as $$y_i[n] = ((z^{pMAX} x) * c_i)[n] = \sum_{k=0}^{N-1} x[n + p_{MAX} - k]c_i[k]. \quad (6)$$

This expression demonstrates that future values of the input x may contribute to the current output value of each $(Y_i)$ if the convolution template signals $c_i$ may be defined to be non-zero in the range of time from $n=0$, $pMAX-1$.

In practice, the amount of time by which template content leads signal content and the level of the pre-signal content relative to the following signal may be both variable and depend on the current input signal analysis results. Pre-signal response times of less than 10 milliseconds may be used, with times ranging from 1 millisecond to as little as 50 microseconds being most common. The introduction of such pre-signal content, particularly in a time-varying and signal-dependent (non-linear) manner, may be designed to prime the human auditory system for the audio content that follows. Due to the phenomenon of temporal auditory masking, such pre-signal priming additions may not result in obvious differences in the sounds that may be heard, but may reduce the instantaneous stress experienced by the auditory system during sudden changes in signal energy.

Figure 7:
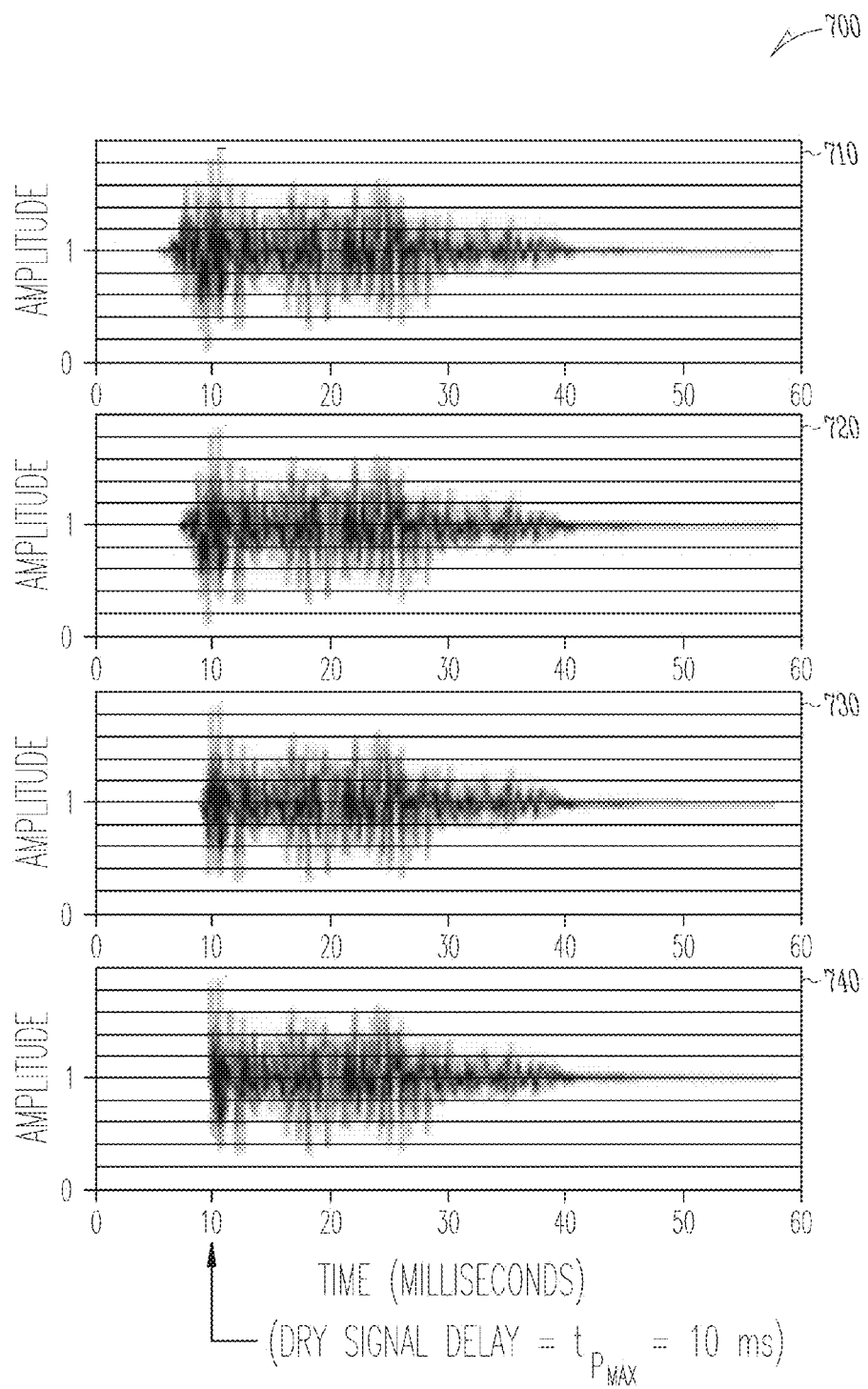
FIG. 7 demonstrates adjustable pre-signal content duration examples in the FIR convolution templates according to various embodiments of the present subject matter.

FIG. 7 illustrates adjustable pre-signal content duration examples 700 in the FIR convolution templates, according to various embodiments of the present subject matter. The first example signal waveform 710 may include the entire input signal. Each of modified signal waveforms 720, 730, and 740 may have increasing dry signal durations, where modified signal waveform represents the maximum dry-signal delay $t_{pMAX}=10$ ms. As shown in FIG. 5, this dry signal may be implemented as a parallel signal and does not enter a convolution subsystem, such as using parallel channel look-ahead delay 540 shown in FIG. 5. Because this parallel input dry signal may be delayed, template content that occurs at lags smaller than this dry-signal delay may be added effectively to the output in response to input signal content that has not yet appeared at the processing system's output. This portion of the convolution template reacts to future input signal and may result in the addition of content to the output signal just prior to audio events such as transients.

Figure 8A:
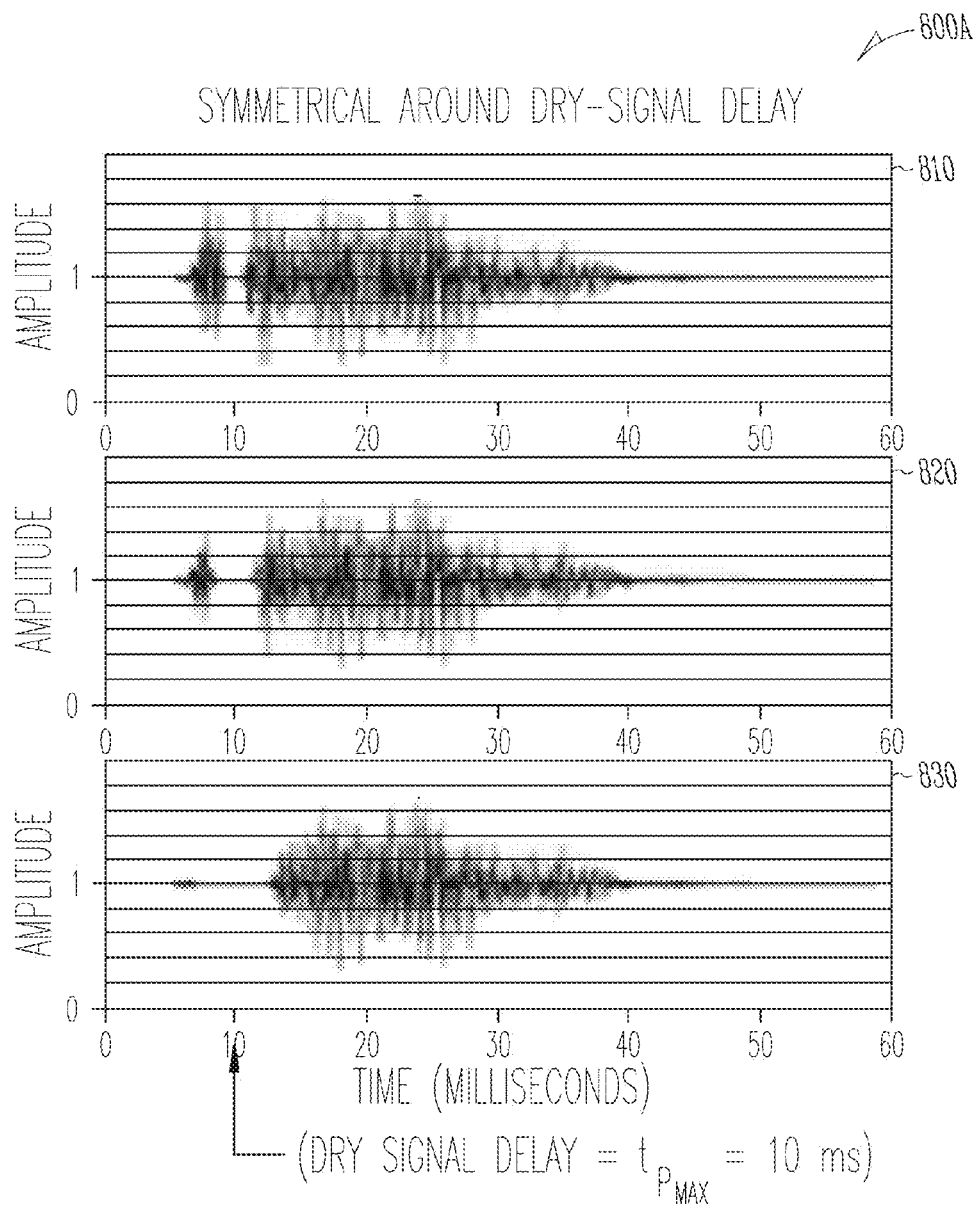
FIGS. 8A-8B demonstrate enforced zero-response examples around the dry signal delay time according to various embodiments of the present subject matter.
Figure 8B:
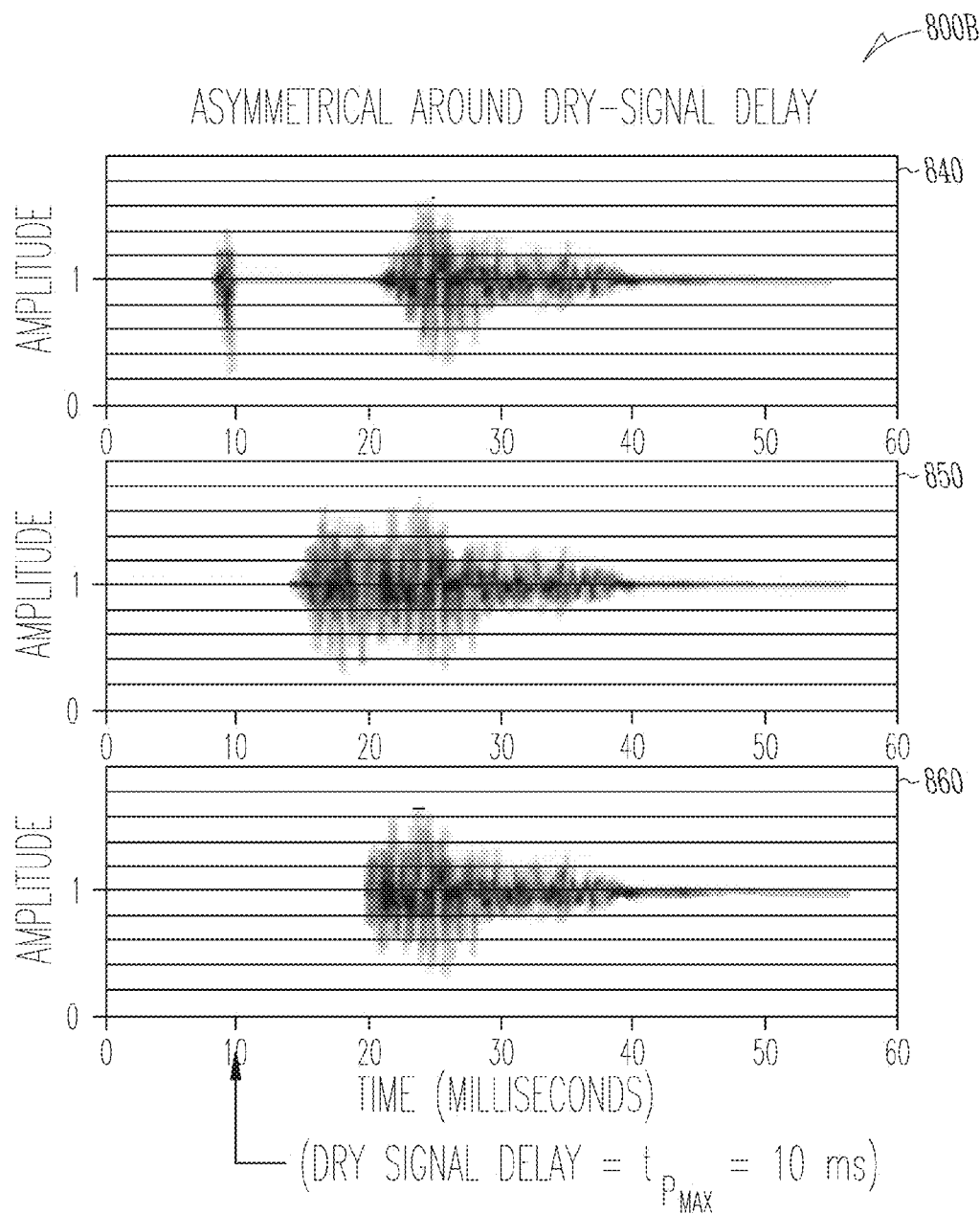

FIGS. 8A-8B illustrate enforced zero-response examples 800A-800B around the dry signal delay time according to various embodiments of the present subject matter. Each of example waveforms 810, 820, 830, 840, 850, and 860 depict a different application of a zero-response signal applied to the input signal 710 shown in FIG. 7. Example waveforms 810, 820, 830, 840, 850, and 860 depict a duration of silence enforced in the convolution templates around zero delay, or the point in time corresponding to the current input signal amplitude, given as $$c_i[n]=0, n=p_{MAX}-k, \ldots, p_{MAX}+l \quad (7)$$

for some numbers of samples (k) and (l). Values (k) and (l) may be selected to minimize the alterations of the way that the input signal sounds.

FIG. 8A includes example waveforms 810, 820, and 830, which depict a symmetric short duration of silence enforced in the convolution templates around zero dry-signal delay $t_{pMAX}$=10 ms. Example waveform 810 shows a small duration of silence, example waveform 820 shows a medium duration of silence, and example waveform 830 shows a large duration of silence. Example waveforms 810, 820, and 830 depict an asymmetric short duration of silence enforced in the convolution templates around zero delay.

FIG. 8B includes example waveforms 840, 850, and 860, which depict asymmetric short duration of silence enforced in the convolution templates. In particular, waveform 840 depicts an asymmetric duration of silence beginning at dry-signal delay $t_{pMAX}$=10 ms, example waveform 850 depicts an asymmetric duration of silence around $t_{pMAX}$=10 ms, and example waveform 860 depicts a large asymmetric duration of silence around $t_{pMAX}$=10 ms. A system may select one of symmetric or asymmetric example waveforms 810, 820, 830, 840, 850, and 860, and therefore select the delay and position of silence, in order to reduce the perception of the artificial duration of silence.

In natural acoustic environments, the sound heard by a listener may be always the combination of an initial direct-path arrival followed by subsequent early reflections. In nearly all cases, this leaves duration of silence (for example on the order of milliseconds) in the room response between the initial first arrival and the first-arriving reflection. Although the details of this first-arriving reflection and other soon-arriving early reflections may vary greatly with the positions of a sound source and listener or the acoustic space in which they reside, these changes in response generally do not alter the observed character of a sound in an obvious way. For example, a particular sound source such as an instrument or a particular person's voice may be recognizable in a wide variety of spaces from a small, enclosed room to a huge cathedral; the sound identified as being produced by the source does not change significantly in character, despite the fact that the sound associated with the space it may be in changes drastically. This may not be to say that such responses cannot contribute to the perceived character of a sound, but to demonstrate that many convolution templates with some duration of silence trailing the zero-delay component may be expected to yield subtle effects on the sound being processed; in fact, recording engineers often put significant effort into choosing the placement of microphones such that a pleasing portion of a source's radiation pattern and initial reflections may be captured during recording. This convolution template design technique may apply this subtlety and correspondence to naturally occurring sound phenomena.

While convolution responses longer than approximately 50 milliseconds in duration may be perceived temporally by the human auditory system, convolution responses shorter than this may be heard spectrally in that they tend to alter the perceived character of the sound being convolved with the response rather than introducing new, separate sounds. The effect of summing multiple, repeated copies of a single signal on that signal's spectrum may be known as comb-filtering. In comb-filtering, a series of evenly spaced frequencies may be cancelled in the signal's spectrum because the contributions from the multiple delayed copies of the input signal at those frequencies may be out of phase and sum to zero. In general, this type of comb-filtering may be largely imperceptible to humans (although particular types of comb-filtering that change systematically over time do, however, form a class of obvious audio effects known as flanging and phasing). The fact that this type of filtering does not create blatantly obvious changes in the character of a sound may be likely because it may be so commonly encountered in natural acoustic spaces, as discussed above. By enforcing a period of silence around the zero-delay component of convolution templates and applying otherwise subtle or low-level responses, the frequency response of the templates tends to occupy this space of comb-filter-like responses that alter the character of the filtered sound in only subtle ways.

In addition to this convolution-based method of modifying the input signal, the input signal may also be modified through the momentary addition of specific noise-like signals, y-noise. These noise signals may be added at times determined by the results of the input signal content analysis, such as during or slightly before transient peaks. This novel procedure may be intended to achieve the goal of auditory stress reduction in a manner similar to that of pre-signal content in convolution templates: the addition of a specific noise-like signal may be designed to prime the auditory system for sudden changes in signal energy and to soften the momentary auditory stress induced by sudden changes in signal energy. Again, due to the phenomena of temporal and simultaneous masking, such additions may not be expected to result in obviously different sounds, despite the fact that they may present a listener with markedly different acoustic signals.

In some embodiments of the present subject matter, the addition of filtered noise may seem analogous to processing performed by generalized lossy perceptual audio compression schemes. Lossy perceptual audio compression techniques can generally be interpreted as adding spectrally shaped noise to recorded digital audio signals that may not be readily audible. However, this interpretation may be based on a typical method for analyzing the results of quantization and does not fully describe the processing performed by such systems. In practice, these systems quantize information about the input signal such as its spectrum during successive blocks of time with varying resolutions, which may result in highly objectionable audible artifacts and correlations between the input signal and resulting quantization error that cause the additive-noise based interpretation to be inaccurate. Furthermore, when considered as adding spectrally shaped noise to the recorded digital audio signal, these compression technologies add broadband noise over the full duration of the audio signal. In contrast to generalized lossy perceptual audio compression techniques that seek to decrease the amount of data required to represent the digital audio signal, this method may be used to improve the experience of listening to an acoustically reproduced version of the audio signal. To improve the listening experience, specifically shaped noise sequences may be added to the input signal only at specific noise times and for specific noise durations in order to decrease the stress experienced by the auditory system at those moments, where the noise durations may make up a small portion of the duration of the input signal. This use of additive noise also differentiates it from simulations of tape or vinyl mediums that introduce noise during the full duration of an audio signal in order to simulate properties of those recording media.

Digital Signal Processing of Priming Signal: Automatic and Signal-Aware Control of the Modification Methods In various embodiments, the modification operations discussed above may be controlled automatically by the results of signal content analysis performed on the input signal. This analysis aims to assess four main characteristics of the input signal: the distribution and complexity of its momentary spectral content, the program, or average, perceived loudness of the signal, the presence of transient bursts of energy or changes in signal content, and, when used on multi-channel recordings, the spatial relationships of these characteristics across the multiple channels. The results of these analyses in turn drive a rule-based control system that may be designed to provide processing that, at any given moment, reduces the stress experienced by the auditory system of a listener while remaining transparent and not obviously audible. In exemplary embodiments of the subject matter, this rule-based control system may consist of a digitally stored look-up table, a set of parameterized functions, or a combination of the two, which relate the outputs of the analysis subsystems to the operation of the modification system components.

While in general this control of the modification processes may be performed without intervention from a human operator, in one exemplary embodiment of the subject matter an operator or application that uses the presently disclosed subject matter may specify one or more high-level operation control parameters prior to applying it to a digital audio signal. Such high-level parameters may describe the kind of content being processed or the type of playback system that may be used to listen to the generated output signal. With the caveat that higher-level specifications may adjust the interpretations of each analyzed signal characteristic, we may now describe how the outputs of these signal characteristic analyses may be used to control the signal modification processes.

Due to the frequency-dependent nature of many auditory processing phenomena such as masking, analysis may be performed to determine the distribution and complexity of the input signal's momentary spectra. This analysis, in turn, guides the determination of which convolution templates to use as well as the relative mixing gains applied to the outputs of each convolution, and, when deemed appropriate by other analyses, the type of noise signal to add to the input. Convolution templates and noise signals may be chosen to complement the current input signal content and to avoid creating obvious audible effects. Modifications that introduce too much content at frequencies that may not be strongly present in the input signal or that may become obvious due to simple, non-complex material may be avoided.

Because the behavior of the human auditory system may be non-linear and generally responsive to relative changes in energy levels, the analysis system estimates the program level, or the average perceived loudness, of the input signal over time. For most audio signals, this estimate may vary gradually with changes in signal content. Relative changes in program level or comparisons between the estimated program level and the known average program level of typical audio recordings (which may vary with the genre of music or type of content contained in the audio signal) may then be used to guide control of the input signal modification system. For example, characteristics such as the pre-signal lead-time used by convolution templates, the relative amount of processed signal mixed with the raw input signal, and the choice of convolution templates may all be affected by the estimated program level.

Audio transients, or short-duration changes in audio signal energy or spectral content, provide a particular kind of stimulus to the human auditory system that requires special processing by the input signal modification system. In order to enable such special processing, the input signal may be analyzed to detect transient events in the audio stream. Once detected, a transient event may be further analyzed for relative energy content, spectral make-up, and duration. Among other things, the detection of these events may control the choice of convolution templates and corresponding mixing gains, the amount of pre-signal lead-time used by the convolution templates, the addition of momentary noise-like signals to the input signal, and the enforcing of a duration of silence around the zero-delay time in convolution templates.

Finally, because digital audio signals may be commonly reproduced on multichannel systems (with stereo, or 2 channel, systems being the most common), an awareness of the spatial image created by multiple signals may be required to avoid introducing changes into the individual audio signals that result in obvious or undesirable effects, where the changes may be perceived when a user listens to the combined output signals through such a multichannel system. When processing audio signals intended for multiple-channel playback, all channels may be processed together. A higher-level analysis that takes as its inputs the single-channel analysis results may be performed, and the output of this higher-level analysis may be used as an additional control input to the single channel modification systems. The result may be that different modifications may be made to each individual input signal than would have been made were the input signals processed in isolation; the control of the modification system must respect an additional set of rules to ensure that the interaction between multiple channels during playback does not have undesirable effects.

Digital Audio Processing for the Restoration of Motion and Dynamic Timbre

The sense of motion, liveliness, and spatial dynamics may be simulated using various methods discussed in this document. These methods may compensate for the static presentation of sound created by modern recording and sound synthesis techniques and common modern playback equipment such as headphones and ear buds in order to create a more natural, immersive, and enjoyable listening experience.

Modern recorded music and sound, unlike naturally produced acoustic sound, may be spatially and timbrally static. Perhaps the most pervasive recording technique in modern audio production may be to record musical performances in a close mic'd manner, meaning that one or more microphones may be placed at static positions close to a musician or sound source and a performance may be recorded with minimal motion being made by the musician in order to produce a consistent loudness and tone across the duration of the recording. While this technique may afford a certain precision in the recording and post-processing of each musician's contribution to a song or musical piece, it deprives the completed recording of the liveliness and timbral dynamics created by motion in more natural performance and listening environments. The use of digitally synthesized sounds in modern recordings can take this dry, static nature to an extreme, producing recorded sound that may be entirely unchanging in tone or character over time. These modern recording techniques and technologies give rise to an unnatural and unpleasant stationary-tone audio-reproduction environment (STARE), in which recorded sound may be experienced as both spatially and timbrally static.

In contrast, when performers play together in an acoustic space their movement alters the spatial radiation characteristics of their instruments over time, gradually changing the timbral qualities of their instruments and exciting various resonances and reflections in the space where they may be performing. Additionally, motion of performers on a stage or of listeners in an audience may change the sound heard by everyone in the audience in small or obvious ways. Even subtle motions of an audience member's head may create shifts in the delays and filtering experienced by the various sound components reverberating about a space before reaching their ears, and thus alter the tonal and spatial qualities of the sound that they hear. All of these dynamic effects contribute to a sense of immersion and liveliness that may be desirable to reproduce when listening to recorded audio.

Although post-processing of close-mic recorded audio may add reverberation or panning effects that help to approximate this feeling of immersion and motion, these effects still present a sound with static tonal and spatial qualities in the sense that we have discussed here: a sound may be made to occupy some space or originate from some direction, but none of the natural, motion-driven variability that we have discussed here may be restored. Certain pieces of revered and highly sought-out analog recording equipment may come closest to providing an existing remedy for this problem of static recorded sound, as such equipment may be known to create subtle, time-varying changes in the tone and imaging of processed signals due to circuit phenomena such as very-low-frequency shifts in the DC-bias points of internal components caused by transient offsets in audio signals; however, this type of equipment may be expensive and thus may not be available to all producers of recorded music. Furthermore, such currently existing equipment may only provide a portion of the variability and dynamics that may be desirable for the re-creation of natural sound environments and the maximization of listening enjoyment.

With the rise of portable music devices and the accompanying increase in the usage of portable playback equipment such as headphones and ear buds, the STARE problem has been taken to an extreme over the past decade: unlike loudspeakers, these personal playback devices prevent even the natural variability in tone that may be associated with a listener moving about a room or turning their head. At the same time, the popularity of close-mic recording techniques and synthesized digital audio has shown no signs of recession. Thus, it may be desirable to introduce digital signal processing techniques that restore a sense of motion and liveliness to digital audio recordings in order to improve the experience of listening to modern digital audio.

A method for processing digital audio signals in order to restore a natural sense of motion and liveliness may be disclosed. The method consists of analyzing a digital audio recording and applying time-varying phase shifts, inter-aural delays, filtering, and amplitude and frequency modulation (e.g., "flutter," "wow") in a subtle way that may be driven by the presence of particular signal characteristics, such as percussive or transient events, that help to make the applied processing non-obvious. This method may compensate for the static tonal and spatial listening experience created by modern recording techniques, digitally synthesized sounds, and popular personal playback devices such as headphones and ear buds. This method may improve the experience of listening to digital audio recordings by restoring a sense of motion and immersion to those recordings that may be commonly experienced in live acoustic settings.

Figure 9:
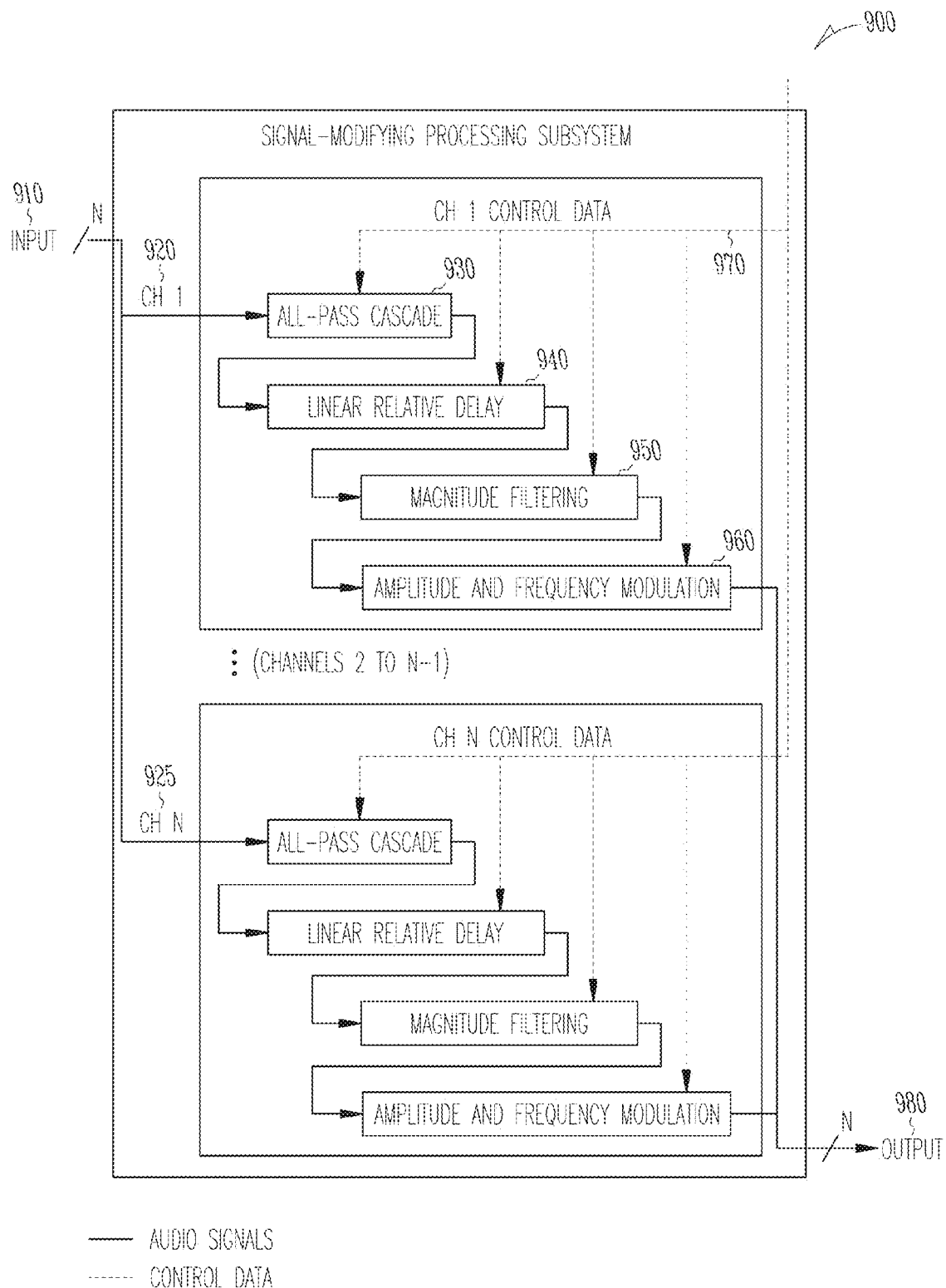
FIG. 9 demonstrates a multichannel analysis signal-modifying processing subsystem according to various embodiments of the present subject matter.

FIG. 9 illustrates an exemplary multichannel analysis signal-modifying processing subsystem 900, according to various embodiments of the present subject matter. Subsystem system architecture 900 demonstrates the general system architecture, consisting of a signal-analysis and processing-control subsystem and a signal-modifying processing subsystem, each of which may handle multiple input signals 910. The system takes one or more input signals 910 that each represent the amplitude of an audio waveform over time. Typically, these signals may each be a series of digitally stored values representing the instantaneous amplitude of a band-limited waveform that has been sampled at regularly spaced moments in time.

The signal-modifying processing subsystem 900 both analyzes and modifies these input signals 905, with the results of input signal analysis determining the modifications to be performed at each point in time. In general, any available data may be analyzed and used to determine the exact modifications to be made to the digital audio signals at each point in their durations, though the presence of transient changes in intensity or energy associated with percussive sounds may play a large role in determining when modifications may be to be made because such sounds have the ability to help mask the applied modifications and make them non-obvious.

Each channel in a multichannel processing system, from channel one 920 to channel N 925, may include multiple processing blocks. For example, channel one 920 may be processed through a frequency-dependent phase shift processing block (e.g., all-pass cascade processing block) 930, a linear relative-delay block 940, a magnitude filtering block 950, and an amplitude and frequency modulation block 960. Each processing block may be modified by control data 970, where control data 970 controls processing parameters within each processing block. Processing may be governed by parameterized equations that relate numerical results of signal analysis to parameters controlling the signal modification algorithms. The output of the processing blocks for each channel may be output from the subsystem 900 as output analysis results 980. Additionally, output analysis results 980 may be used to select a particular modification algorithm from a collection of available, implemented algorithms for use on a particular signal or time-region of a signal through some logical or rule-based processing of output analysis results 980.

Implementation of the relationship between signal analysis and modification may be controlled or adjusted by higher-level parameters to select a particular relationship from a collection of options: for example, a high-level analysis of the input signals may determine the type of audio content that may be currently being processed (a general, individual instrument or some identified particular instrument, a complex sound mixture of multiple instruments, a sound mixture identified to belong within a particular genre of music, etc.) and use this determination to choose a particular relationship between analysis output and modification from a collection of relationships that may be each most appropriate for a certain type of content. Such high-level control and any lower level parameters of the relationship between analysis and modification may be exposed to an end-user through some type of interface for manual adjustment, or may be performed automatically.

Once an analysis configuration and relationship between output analysis results 980 and signal modifications has been determined, time-varying modifications may be made to the input signals 910 to create a sense of motion and liveliness in the recorded audio, thereby improving the experience of listening to it during subsequent playback. These modifications may be performed in a way that may be subtle enough to avoid being overtly noticeable by listeners and that may be neutral enough to avoid altering the creative content of the audio recording, while still creating an appreciable, pleasing effect.

Significant motion effects may be achieved within the all-pass cascade processing block 930. The all-pass cascade processing block 930 may introduce time-varying, frequency-dependent phase shifts, potentially applying different shifts to each channel in a stereo or multichannel recording. Such modifications can be performed using digital all-pass filtering, using filters with transition frequencies and orders that vary over time. It has been demonstrated in psychoacoustics experiments that the effects of such phase shifts, which correspond to sound components moving closer and further away, can be perceptually subtle when compared with magnitude, or non-all-pass, filtering. To reduce the perception of the phase shift, a bandpass filter may be used to avoid shifting the phase of the bass or treble. The bandpass filter may include frequencies ranging from 500 Hz to 5 KHz. This provides a neutral and subtle way of animating sound content. In various embodiments of the presently disclosed subject matter, changes in imposed phase shift may often occur in-sync with percussive audio transients, with the amount of shift increasing during transients and then slowly drifting back toward zero over the course of approximately 200 to 500 milliseconds, or in a semi-periodic cyclical fashion at a similar rate.

The linear relative-delay block 940 may modify digital audio recordings in order to instill a sense of motion may be using time-varying inter-aural delays. When a sound source moves about a space relative to a listener or a listener rotates their head relative to a source, varying amounts of delay may be experienced by sound as it travels to the listener's left and right ears. Because of this, applying small, time-varying amounts of relative delay between the left and right channels of a stereo audio recording or among multiple channels in a multichannel recording can create a sense of movement and variability similar to the motion that naturally occurs when listening to a live performance. Because listeners have been found in psychoacoustics experiments to be able to detect horizontal displacements of less than one degree in the horizontal plane, the relative delays imposed by the modification system in this way need not be large in order to create a sense of motion. In fact, using too large a modification may be likely to be distracting and prevent the desired subtlety. Various embodiments may impose time-varying relative linear delays of approximately 0.1 millisecond or less across channels in a stereo or multichannel recording. As with imposed frequency-dependent phase shift, the amount of applied relative linear delay may vary in-sync with percussive or transient audio events, or may oscillate in a semi-periodic fashion that may be more loosely driven by signal properties.

The magnitude filtering block 950 may be used to simulate a radiation pattern corresponding to motion of an audible source or listener. The radiation pattern of a sound source may change in response to the motion of performers around it or the way that a performer makes contact with it, and the transfer function from a source to a listener due to the acoustic space that they occupy may change significantly as either person moves about or rotates within the space. Typically, these phenomena may give rise to general changes in timbre that may be simulated using low-order IIR (infinite impulse response) filters with transition or cut-off frequencies and gains that change over time or comb-filtering effects caused by the summation of multiple reflections of sound that can similarly be modeled using digital FIR (finite impulse response) or IIR filters that change over time. Both of these types of filters may be designed to produce subtle effects, and thus provide the types of modification desired by the presently disclosed system; by varying their application in response to characteristics of the input signal, such magnitude-filtering may be performed in a way that creates a sense of motion and liveliness without becoming obvious or altering the creative content of the modified recording.

The amplitude and frequency modulation block 960 may be used to impose subtle time-varying amplitude modulation (e.g., "wow") and frequency modulation (e.g., "flutter") on digital audio recordings in order to create an enhanced sense of motion and dynamics. These effects may be familiar in the audio world because they result from imperfections in common analog playback systems, such as tape and vinyl While these effects may be overt, distracting, or detrimental to playback quality, they may be used subtly to create neutral and subliminal but perceivable motion and complexity in an audio recording. Various embodiments of the presently disclosed subject matter may apply time-varying, semi-periodic frequency modulation of less than ±1 cent (where 1 cent represents the $\frac{1}{100}$ of the difference between each semitone within an octave) and amplitude modulation of less than ±1 dB, at oscillation rates below about 5 Hz. As with other modifications, the exact amount and rate of modulation may be driven by the analysis of input signal and may vary in response to the low-passed energy envelope of the signal, the presence of discrete, identified transients, momentary spectral complexity, or any other suitable property.

Automatic Level-Dependent Pitch Correction of Digital Audio

A pitch correction signal processing technique modifies digital audio recordings to correct for level-dependent shifts in the perceived pitch of audio content. These corrections compensate for the effects of sound level on perceived pitch, corrections that may be impractical to apply during performance or recording. These corrections may improve the experience of listening to digital audio recordings by adjusting the perceived pitch of an audio signal dynamically. The dynamic adjustment may be dependent upon the momentary loudness of the audio signal (e.g., audio signal intensity, audio signal power, audio signal level, audio signal volume).

The concept of auditory or musical pitch may be a perceptual one: while the pitch of a sound tends to be strongly related to mathematical properties of the associated acoustical wave such as its periodicity or frequency content, the relationship between such numerical properties and the perception of pitch may be more complex. Significant research into this relationship was performed in the 1930's at various academic institutions and at Bell Labs, and this research revealed a strong interaction between the level at which a sound may be heard and its perceived pitch, meaning that the same sound heard at different levels or volumes may be perceived as having different pitches, even when no other mathematical properties of the sound signal (such as periodicity or frequency content) have changed.

At that time, studies were performed that further elucidated this relationship between sound level and pitch. It was demonstrated that the amount of shift in perceived pitch for a given change in sound level may be dependent upon a complex interaction of signal characteristics, including the frequency content and absolute level of a sound. One trend characterizing this relationship may be that for a simple tone (e.g., single frequency sinusoid), as level increases, the perceived pitch of that tone decreases for frequencies below about 2000 Hz and increases for frequencies above about 2000 Hz. A general characterization of the relationship between the level, frequency content, and perceived pitch of complex sounds (sounds with multiple frequency components) has not been fully characterized for all complex sounds. However, it was found that the shifts in perceived pitch that occur for complex sounds at varying levels may be predicted by a weighted mean of the shifts that would occur for each sinusoidal component of the sound if they were heard individually. This finding suggests that, because many sounds produced by musical sources contain frequency content both above and below the zero-shift frequency of about 2000 Hz, most musical audio material may demonstrate small shifts in perceived pitch with changes in level relative to the shifts demonstrated by simple tones.

This phenomenon, that perceived pitch may be dependent upon sound level, poses a subtle problem for musicians and recording engineers. Generally, musicians optimize the tuning of their instruments and their playing techniques to compensate for this effect when performing live together in a group. Such adjustments may be subconscious or habitual rather than overt and deliberate, with professional musicians constantly making minute adjustments based on instinctual knowledge of their instruments and the feedback provided by their perception of pitch; however, it may be common in modern recording workflows for musicians to record their contributions to a song in isolation so that the individual sounds may later be layered or mixed together to form a final recording by a mix engineer, as this affords much more flexibility for adjusting the individual recordings and applying post-processing to individual sounds. In this case, performing musicians cannot make the same adjustments to ensure that all parts of the resulting sound mixture may be perceived to have their desired pitches. Additionally, many instruments do not provide musicians with the capability of making such subtle adjustments to the perceived pitch of the sound they produce, meaning that regardless of the recording situation there may be room for improvement through post-processing of recordings to make these adjustments. Finally, when numerical tools such as frequency content analysis may be relied upon to tune instruments or later adjust the tuning of recorded sounds, this may not compensate for the phenomenon of perceived pitch may not be solely determined by frequency content may be usually neglected. This may result in sounds that may be in need of further dynamic pitch adjustment to achieve or maintain desired musical pitches.

Because the perceived pitch of musical sound plays a large role in its emotional impact and perceived quality, even minor pitch adjustments may have a noticeable impact on the listening experience. Research into psychoacoustics has demonstrated that the perceived pitch of a sound may be effected by the level at which that sound may be heard, meaning that minor adjustments to produced sounds may be required to sustain a particular pitch across differing sound levels. Because modern recording techniques make it difficult or impossible for musicians to make these adjustments during performance and because such adjustments may not be possible, using digital signal processing techniques to apply dynamic, level-dependent adjustments to the pitch of recorded digital audio, when appropriate, may greatly enhance the listening experience.

A method for processing digital audio signals in order to correct for level-dependent shifts in the perceived pitch of audio content may be disclosed. The method consists of analyzing a digital audio recording and creating small, dynamic shifts in perceived pitch as required to compensate for the pitch distortion caused by relative changes in momentary sound level. This method may be suitable for processing of any type of digital sound recording, including individual sound recordings and complex sound mixtures. This method may compensate for modern recording techniques that make it difficult or impossible for musicians to make such adjustments correctly in produced pitched during recorded performances and to improve the perceived pitch of recorded digital audio across changes in relative level wherever possible. By correcting these small pitch distortions, the perceived quality of digital audio recordings may be improved without altering their creative content.

Figure 10:
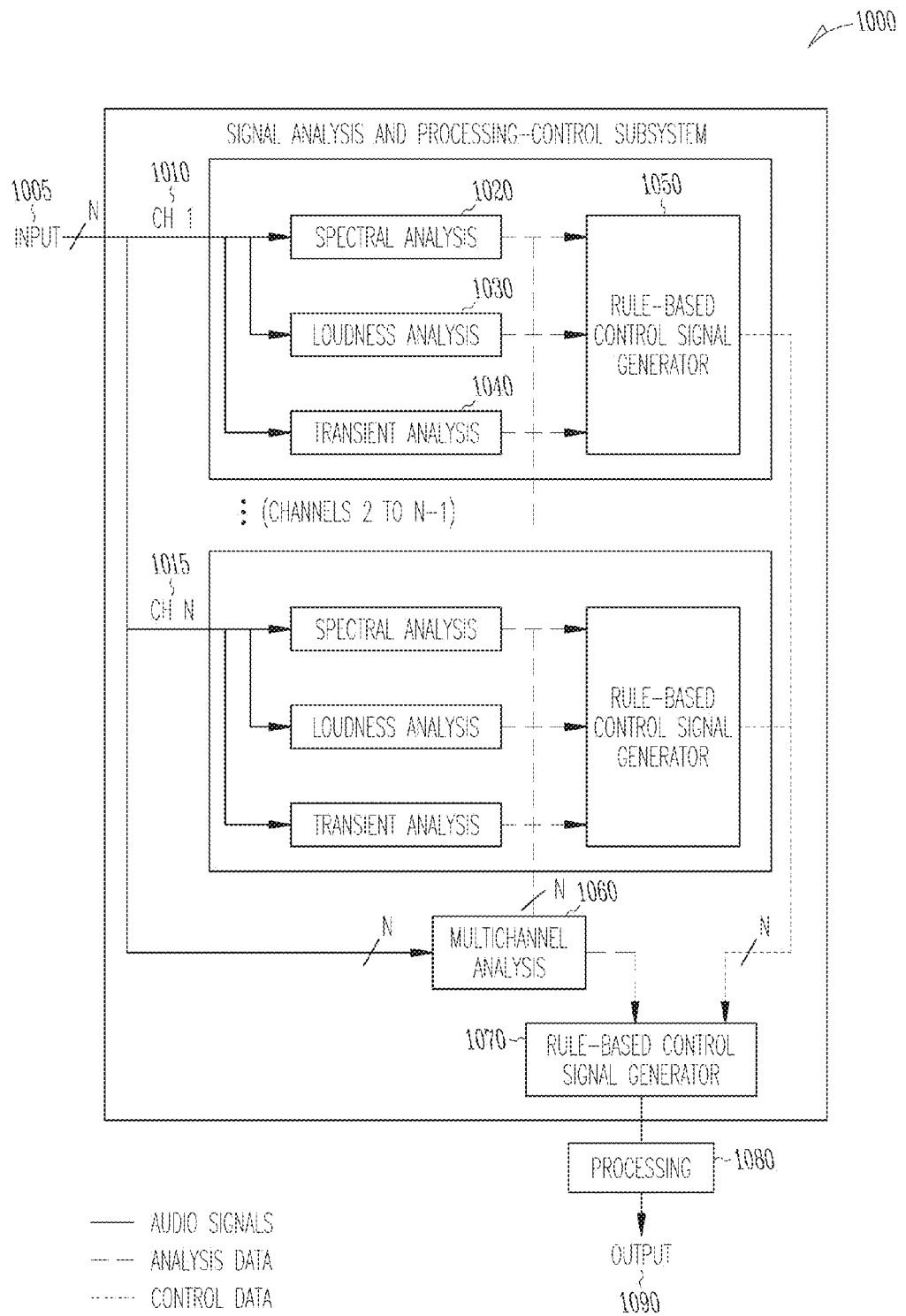
FIG. 10 demonstrates a series single-channel analysis subsystem according to various embodiments of the present subject matter.

FIG. 10 illustrates a series single-channel analysis subsystem 1000, according to various embodiments of the present subject matter. FIG. 10 demonstrates one embodiment of the signal-analysis subsystem in which channels of audio may be analyzed individually by parallel single-channel analysis systems, the output of which may be then further processed by a higher-level multichannel analysis system that may lead to modifications of the resulting single-channel control decisions.

Series single-channel analysis subsystem 1000 may operate on multiple input audio waveform channels 1010 and 1015. Each input audio waveform channel may be analyzed using a spectral analysis module 1020, a loudness analysis module 1030, a transient analysis module 1040, and a rule-based control signal generator 1050. The output of the spectral analysis module 1020, the loudness analysis module 1030, or the transient analysis module 1040 may be processed within a multichannel analysis module 1060. The output of the rule-based control signal generator 1050 may be combined with outputs from other rule-based control signal generators within an aggregating rule-based control signal generator 1050. The output of the aggregating rule-based control signal generator 1070 may be processed within a processing module 1080, and may generate an output waveform 1090.

FIG. 11 illustrates a parallel single-channel analysis systems signal-analysis subsystem 1100 according to various embodiments of the present subject matter. FIG. 11 demonstrates one embodiment of the signal-analysis subsystem in which channels of audio may be analyzed individually by parallel single-channel analysis systems, the output of which may be then further processed by a higher-level multichannel analysis system that may lead to modifications of the resulting single-channel control decisions.

Parallel single-channel analysis subsystem 1100 may operate on multiple input audio waveform channels 1110. Each input audio waveform channel may be analyzed using a spectral analysis module 1120, a loudness analysis module 1130, a transient analysis module 1140, and a rule-based control signal generator 1150. The output of the spectral analysis module 1120, the loudness analysis module 1130, or the transient analysis module 1140 may be processed within a multichannel analysis module 1160. The output of the rule-based control signal generator 1150 may be combined with outputs from other rule-based control signal generators within an aggregating rule-based control signal generator 1150. The output of the aggregating rule-based control signal generator 1170 may be processed within a processing module 1080, and may generate an output waveform 1090.

Figure 12:
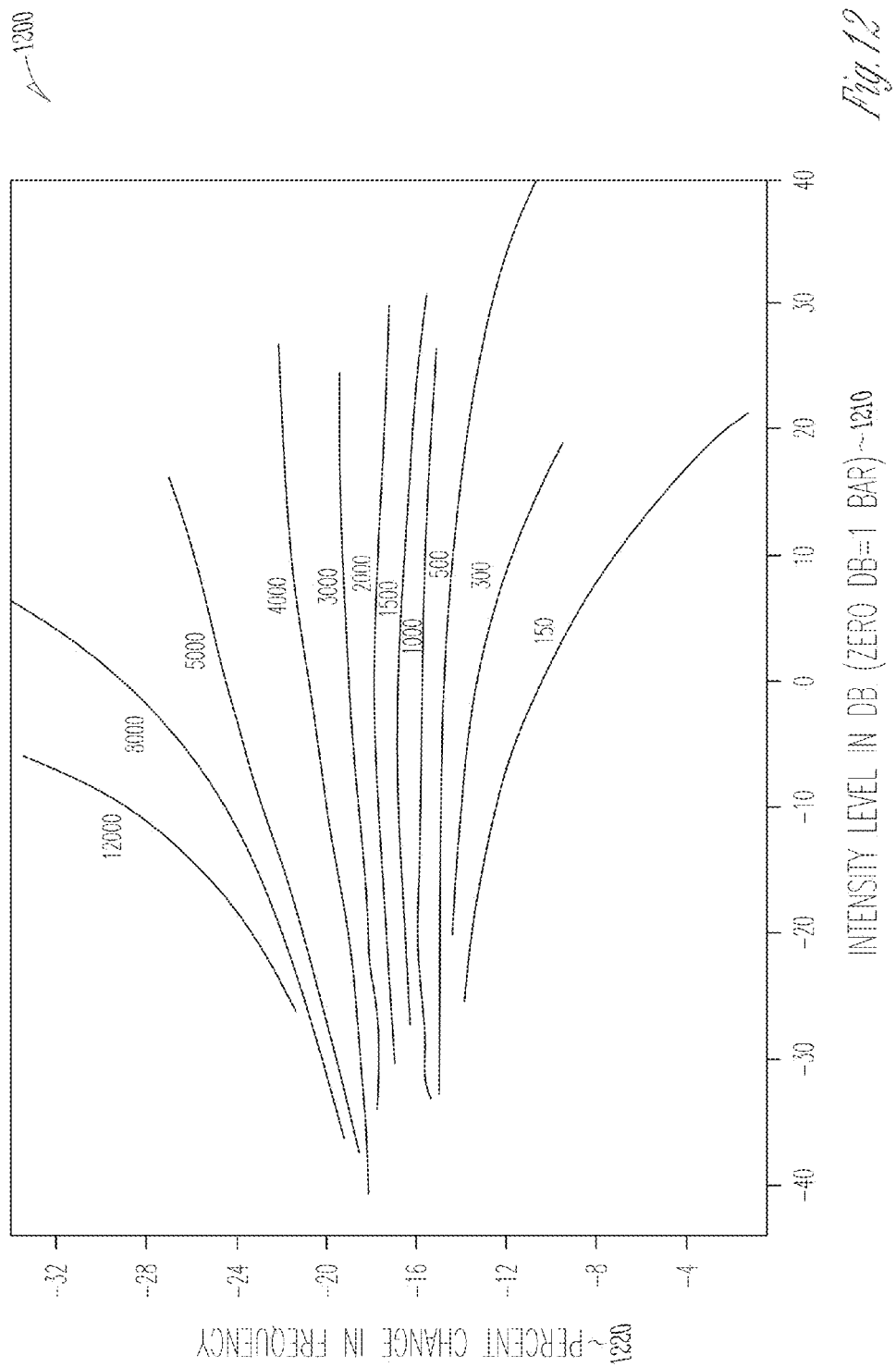
FIG. 12 shows the dependence of perceived pitch on sound level according to various embodiments of the present subject matter.

FIG. 12 shows the dependence of perceived pitch on sound level 1200 according to various embodiments of the present subject matter. FIG. 12 shows the dependence of perceived pitch on sound level as determined experimentally by Stevens S. for a particular test subject. This plot shows the percent change in perceived pitch 1220 as a function of sound intensity 1210 for a variety of frequencies spanning the audible range. Absolute position on the y-axis for each curve may be arbitrary only relative change may be depicted. FIG. 12 demonstrates the finding that the perceived pitch of simple, sinusoidal tones with frequencies below about 2000 Hz decrease as the level of the tone increases while the perceived pitch of sinusoidal tones with frequencies above about 2000 Hz increase as the level of the tone increases. The changes depicted here for simple tones may be used to predict the effects of changes in sound level on the perceived pitch of complex musical tones and sounds, which may be used to determine appropriate compensatory pitch-shift amounts.

Figure 13:
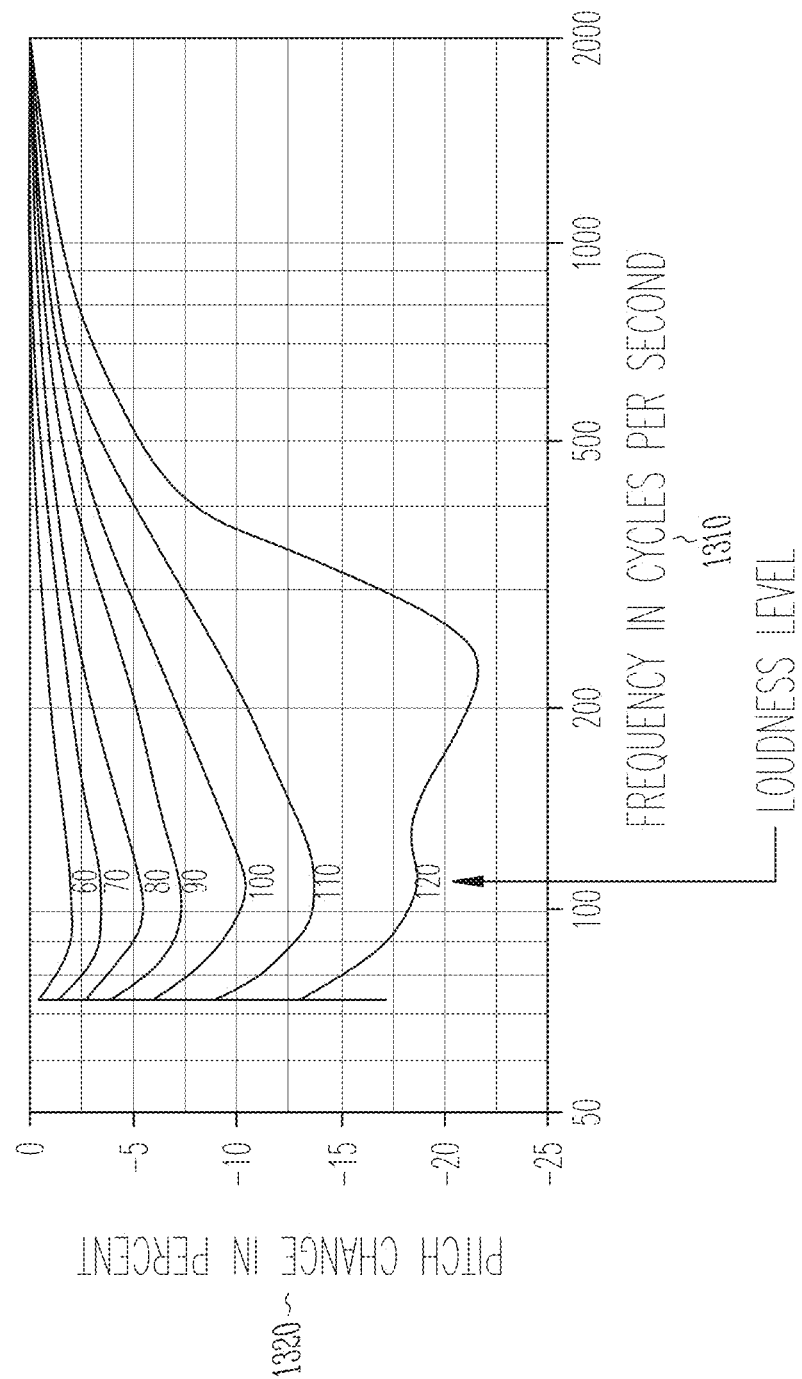
FIG. 13 shows the dependence of perceived pitch on sound level at low frequencies according to various embodiments of the present subject matter.

FIG. 13 shows the dependence of perceived pitch on sound level at low frequencies 1300 according to various embodiments of the present subject matter. FIG. 13 shows the dependence of perceived pitch on sound level at low frequencies as interpreted from experimental results by Snow, W. in his 1936 paper, "Change of Pitch with Loudness at Low Frequencies" (J. Acoust. Soc. Am., vol. 8, no. 1, pp. 14-19, 1936). Experimentally determined curves such as these may be used in determining appropriate compensatory amounts of pitch-shift to apply in response to changes in signal intensity or level.

As discussed above with respect to Multiplexed Convolution, any implementation of the relationship between signal analysis and modification may be controlled or adjusted by higher-level parameters to select a particular relationship from a collection of options: for example, a high-level analysis of the input signals may determine the type of audio content that may be currently being processed (a general, individual instrument or some identified particular instrument, a complex sound mixture of multiple instruments, a sound mixture identified to belong within a particular genre of music, etc.) and use this determination to choose a particular relationship between analysis output and modification from a collection of relationships that may be each most appropriate for a certain type of content. Such high-level control and any lower level parameters of the relationship between analysis and modification may be exposed to an end-user through some type of interface for manual adjustment, or may be performed automatically.

Once an analysis configuration and relationship between analysis results and signal modifications has been determined, time-varying modifications may be made to the perceived pitch of the input signals. These pitch shifts may be small, such as in the range of a shift in frequency of 0.015 to 1.15 percent (e.g., 0.25 to 20 cents, where 100 cents represents the difference between each semitone within an octave).

These small pitch shifts may be in accordance with the small perceptual shifts in pitch that occur for complex musical sounds with relative changes in level, and different amounts of pitch or frequency shift may be applied to separate spectral bands of the input signal. In one embodiment of the presently disclosed subject matter, positive pitch-shift may be applied to signal content at frequencies above about 2000 Hz as signal levels fall below a nominal reference level in order to compensate for the decrease in perceived pitch that occurs for sinusoidal components in this frequency range as level decreases. In another embodiment of the subject matter, the input signal may be split into numerous frequency bands and varying amount of pitch or frequency shift may be applied to each band according to analysis results in order to compensate for the changes in perceived pitch associated with the frequency content of each band during changes in relative sound level.

Several algorithms for applying pitch-shift or frequency-shift may be known to those skilled in the art of audio signal processing. Any one or multiple of these algorithms may be applied to the input signals or portions of the input signals (isolated frequency bands, for example) to achieve the desired changes in perceived pitch, as determined by signal analysis. If multiple algorithms were implemented and made available to the operator, the operator may determine which algorithm may be best suited to a particular bit of audio signal. Alternatively, analysis of that audio signal may be used to determine automatically which algorithm may be best suited to each portion of audio signal.

Multiplexed Convolution

A multiplexed convolution signal processing architecture applies multiple distinct types of processing to an input signal simultaneously in an adaptive, signal-aware way through the calculation of one or more time-varying convolutions. The convolution kernels may be associated with points in a multidimensional behavior space, where coordinates correspond to parameters of the distinct processes being implemented. The values of these parameters change over time in response to input signal properties, adaptively changing the convolution kernels and thus the results of processing.

In the present case, such processing may be achieved through the calculation of generalized convolution operations between an input signal and a time-varying convolution kernel, where the content of the kernel varies in response to properties of the input signal. The mathematical operation of convolution between two functions, $$(f*g)(t) = \int_{-\infty}^{\infty} f(\tau) g(t-\tau) d\tau, \quad (8)$$

may be fundamental to linear systems analysis and may be well known in a variety of fields, including the field of signal processing. The output of any linear time-invariant (LTI) system may be defined for arbitrary input signals as the result of convolution between those input signals and a function known as the system's impulse response. This input-output relationship provides an extremely concise and powerful way of mathematically characterizing a broad class of systems that may be commonly encountered in the physical world and that may be frequently used in an endless variety of applications. In more common notation, this relationship can be expressed as $$y(t) = \int_{-\infty}^{\infty} h(\tau) x(t-\tau) d\tau \quad (9)$$

for an input signal x(t), time-invariant system impulse response h(t), and corresponding output signal y(t).

The convolution defined in equation (8) and equation (9) may be a linear operation and thus cannot be used directly to implement nonlinear processing. However, it may be possible to formulate the input-output relationship of a system whose behavior varies over time in response to characteristics of the input signal as a form of generalized convolution that may achieve nonlinear system behavior. The main difference between such an alternative formulation of convolution and the standard definition presented in equation (8) may be that the two functions, f and g, do not remain independent of one another. In terms of the more standard linear system notation presented in equation (9), the system response h(t) becomes dependent upon not just time t, but the input signal x(t) itself. While this introduced dependence may make the analysis of overall system behavior much more complicated, it also creates the possibility for more complex system behavior such as nonlinear processing.

For example, we may use the definition $$y(t) = \int_{-\infty}^{\infty} H\{SHIFT_{-t}\{x\}\}(\tau) x(t-\tau) d\tau, \quad (10)$$

where $H\{\cdot\}$ and $SHIFT_t\{\cdot\}$ define operators whose domains may be the set X of all functions x with the real numbers as both their domain and range, $X=\{x|x:R\to R\}$, and whose ranges may be the same set of functions, written as $H:X\to X$ and $SHIFT_t: X\to X$. In this case, the operator $H\{\bullet\}$ defines the relationship between the input signal x(t) and the system response h(t) in a general way, and the operator $SHIFT_t\{\bullet\}$, defined as $$SHIFT_t\{x(\alpha)\}=x(\alpha-t), \quad (11)$$

serves the purpose of making the input-output relationship of the overall system time-invariant, meaning that the relationship between the input signal x(t) and the system response h(t) defined by $H\{\bullet\}$ takes into account only relative differences in time between input and output and has no sense of overall time.

The generalized convolution operation defined in equation (10) characterizes the dynamic system through a particular kind of time-varying system function known as an input delay-spread function, albeit one that has the unusual property of being dependent upon the input signal itself. A similar definition with slightly different behavior may be written as $$y(t)=\int_{-\infty}^{\infty} H\{SHIFT_{-(t-\tau)}\{x\}\}(\tau)x(t-\tau)d\tau, \quad (12)$$

where the dynamic system may be instead characterized through a time-varying system function known as an output delay-spread function. The difference between these types of time-varying system functions may be in whether the particular system function at time t, ht(τ), may be constant for a time t associated with the output signal being calculated or with the input signal being used to calculate the output. Otherwise, both definitions capture the same dependence of system behavior upon the input signal x(t) and provide essentially the same definition of a generalized convolution operation.

The system definitions given in equations (10) and (12) make it possible to achieve both linear and nonlinear system behavior with the same general system architecture, and thus provide a unifying framework through which multiple different processes may be applied to a signal simultaneously; however, this type of general, dynamic system description has not been used to unify multiple simultaneous processes in this way previously. Because multiple distinct processes performed on an input signal can interact in complex ways when some of the processes may be nonlinear, and because various system architectures may exhibit different behavior when made to be time-varying, it may be desirable to devise such a unified system so that all individual processes may be controlled simultaneously in a way that takes their interactions into account and allows for the desired overall processing to be consistently achieved when making changes to parameters of one or more of the individual processes.

A method for processing digital signals in order to simultaneously implement multiple linear and/or nonlinear processes in a general way that allows for control of interactions between each stage of processing and adaptive, signal-aware system behavior is disclosed. The method consists of defining a range of system behaviors, each designed to achieve the best overall processing results associated with a set of parameter values describing the individual implemented processes, and then analyzing input signal properties to determine the desired values for these parameters at each moment in time. The connection between analysis results and system behavior may be described by a multidimensional system-behavior space in which coordinates correspond to parameters of the distinct processes being implemented: Each designed system behavior may be associated with a point in this space, and analysis of input signal properties determines where in the space the system should currently be operating. All possible system behaviors may be described in a consistent and general way as one or more generalized convolutions whose outputs may be combined to generate the system output, allowing for smooth transitions and interpolations between specified system behaviors, control of interactions between the various implemented processes by way of total system behavior specification, and consistent time-varying behavior across all implemented processes.

A unified system may simultaneously implement multiple linear and/or nonlinear processes in a manner that may be time-varying responsive to various characteristics of the input signal. Because processes implemented through different architectures may exhibit inherently different behavior when made to be time-varying and because the interactions between multiple stages of processing may be complex when nonlinear processes may be performed, such a unified system may be intended to allow for more consistent and detailed control of overall system behavior when multiple processes may be to be applied to an input signal simultaneously in a time-varying, signal-aware manner.

A system that processes digital signals in a way that allows for the simultaneous application of multiple linear and/or nonlinear processes in a general, well-controlled, and signal-aware way is disclosed. The system takes as its input one or more digital signals. These signals may each be a series of digitally stored values representing the instantaneous amplitude of a band-limited waveform that has been sampled at regularly spaced moments in time. In many embodiments of the presently disclosed subject matter, these digital signals may represent digital audio signals, corresponding to the sampled amplitude of an audio waveform over time.

The presently disclosed system both analyzes and modifies these input signals, with the results of input signal analysis determining the modifications to be performed at each point in time. This relationship between analyzed signal properties and resulting modifications may be established by indexing into a multidimensional system-behavior space with coordinates that correspond to parameters of the various individual processes being implemented. The results of input signal analysis at any given moment determine the desired parameter values for all of the individual processes, and thus a particular point in behavior space. The predetermined (designed) system behavior associated with that particular point in behavior space may be then used to calculate the system output. As input signal properties vary over time, so do the associated point in behavior space, and thus the overall system behavior.

Figure 14:
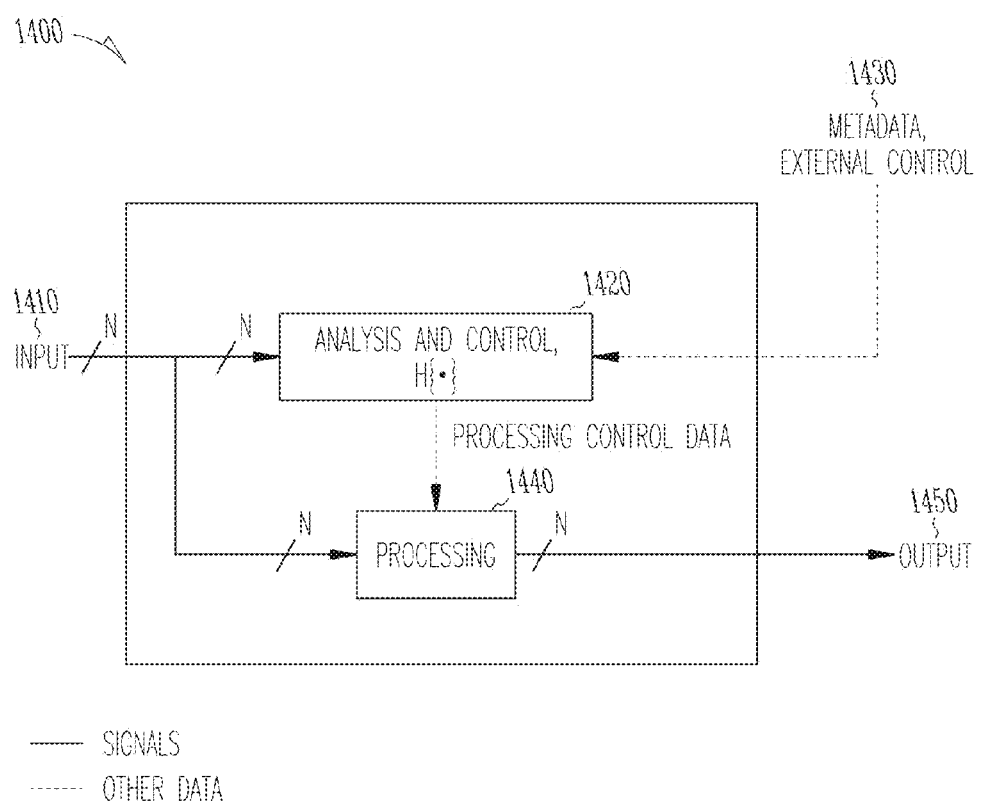
FIG. 14 demonstrates a general multiplexed convolution system architecture according to various embodiments of the present subject matter.

FIG. 14 demonstrates the multiplexed convolution system architecture 1400 according to various embodiments of the present subject matter. FIG. 14 consists of a signal-analysis and processing-control subsystem 1420 and a signal-modifying processing subsystem 1440, each of which may handle multiple signals of data at once.

Figure 15:
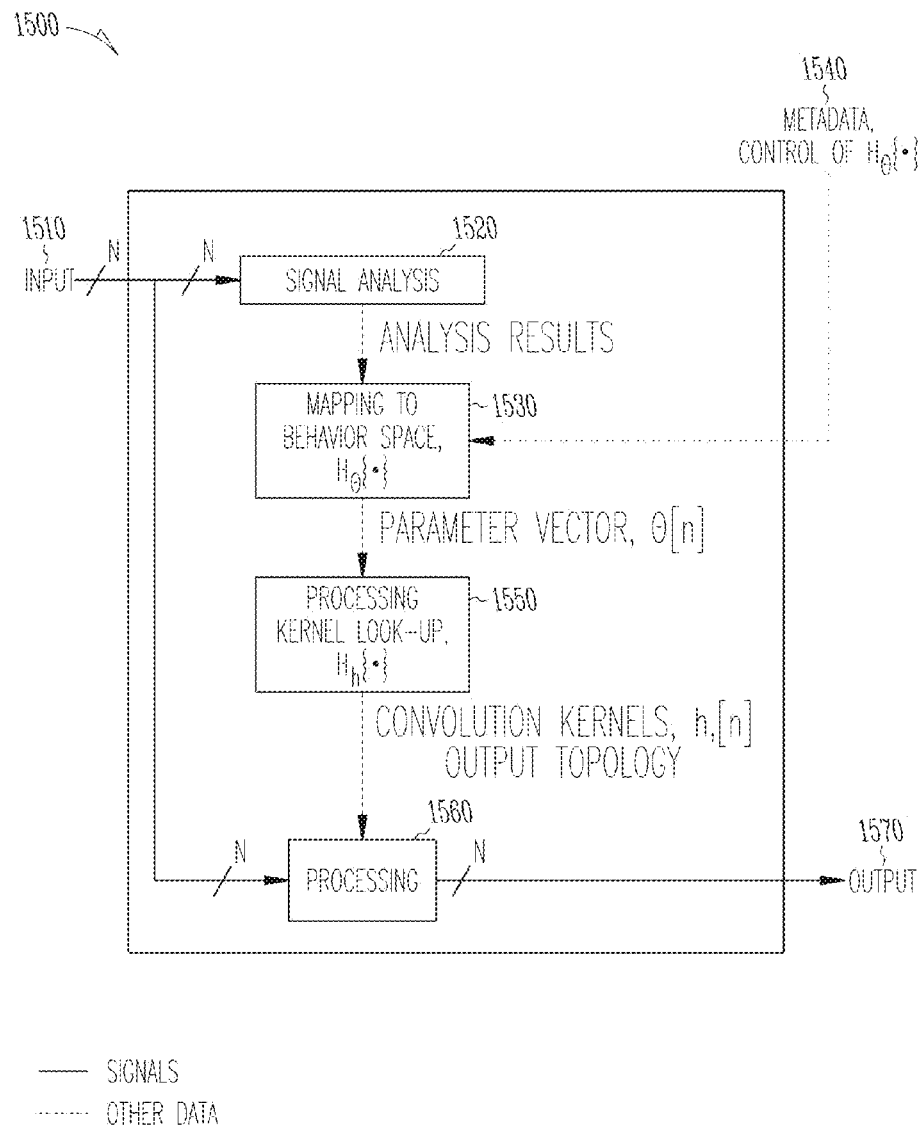
FIG. 15 demonstrates a multiplexed convolution signal-analysis and processing-control architecture according to various embodiments of the present subject matter.

FIG. 15 demonstrates the multiplexed convolution signal-analysis and processing-control architecture 1500 according to various embodiments of the present subject matter. FIG. 15 illustrates the system architecture of the subject matter with the signal-analysis and processing-control subsystem depicted in more detail as consisting of three main steps: signal analysis 1520, mapping from analysis results to a point in behavior space 1530, and processing a kernel look-up 1550 by determining current system behavior based on the location of that point in behavior space. Mapping to behavior space 1530 may receive metadata 1540 as input.

Subsystem architecture 1500 may include a processing module 1560 that combines one or more input channels 1510 with the output of the kernel look-up 1550 to generate an output waveform 1570.

FIG. 16 shows a multiplexed convolution signal analysis processing subsystem 1600 according to various embodiments of the present subject matter. FIG. 16 shows an embodiment of the signal analysis subsystem for a case where digital audio signals may be processed. Several types of analysis, including spectral analysis 1630, loudness analysis 1640, transient analysis 1650, and a multichannel relationship analysis 1660 may be performed. The analysis results may be combined with each other, or may be combined within a data packager 1670 to determine the desired individual process parameter values associated with current input signal properties, and thus the system's current location in behavior space.

Figure 17:
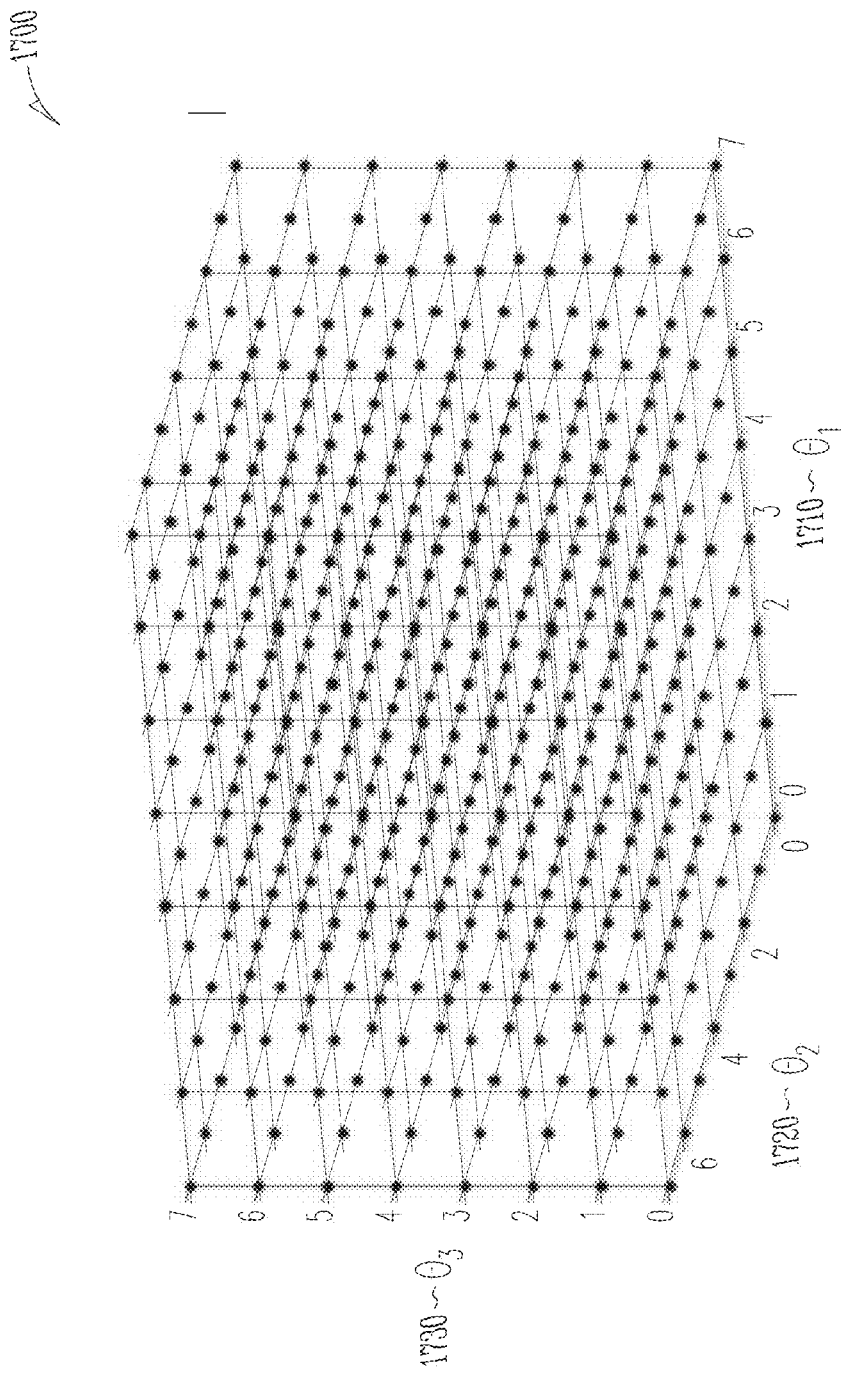
FIG. 17 shows an exemplary three-dimensional, discrete behavior space according to various embodiments of the present subject matter.

FIG. 17 shows an exemplary three-dimensional, discrete behavior space 1700 according to various embodiments of the present subject matter. FIG. 17 shows an exemplary three-dimensional, discrete behavior space, denoted $\Theta$, where each parameter, $\theta_i$ (i=1 (1710), i=2 (1720), i=3 (1730)) can take on any of 8 integer values ranging from 0 to 7. In this example, it may be the case that three individual processes may be being implemented simultaneously and that each parameter controls the general degree to which each process may be applied to the input signal. Each process would thus operate at one of 8 levels. A system behavior may then be specified for each point in this space, taking potential interactions between the individual processes into account and ensuring that the behavior varies smoothly everywhere.

Figure 18:
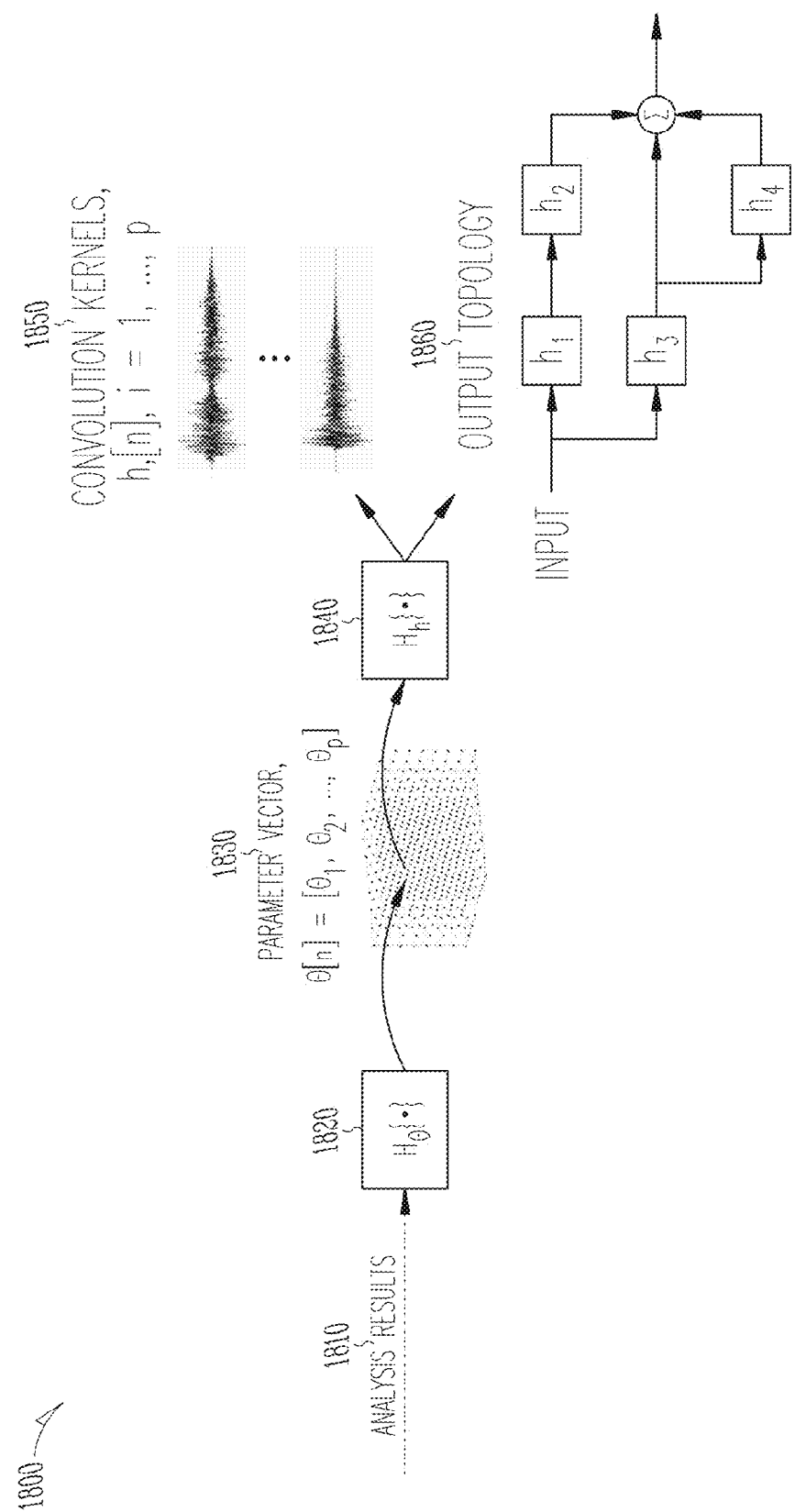
FIG. 18 presents an illustrative diagram of behavior space mapping and system-behavior determination operations according to various embodiments of the present subject matter according to various embodiments of the present subject matter.

FIG. 18 presents an illustrative diagram of behavior space mapping and system-behavior determination operations 1800 according to various embodiments of the present subject matter according to various embodiments of the present subject matter. FIG. 18 presents an illustrative diagram of the overall system architecture, similar to FIG. 15, but using a graphical representation of the behavior space mapping and system-behavior determination operations. FIG. 18 demonstrates the general system architecture of the subject matter with the signal-analysis and processing-control subsystem depicted in more detail as consisting of three main steps: receiving signal analysis 1810, identifying a behavior space 1820, parameterizing the input signal 1830, mapping the analysis results to a point in behavior space 1840, and processing a kernel look-up 1850 by determining current system behavior based on the location of that point in behavior space, and generating an output waveform 1860.

Figure 19:
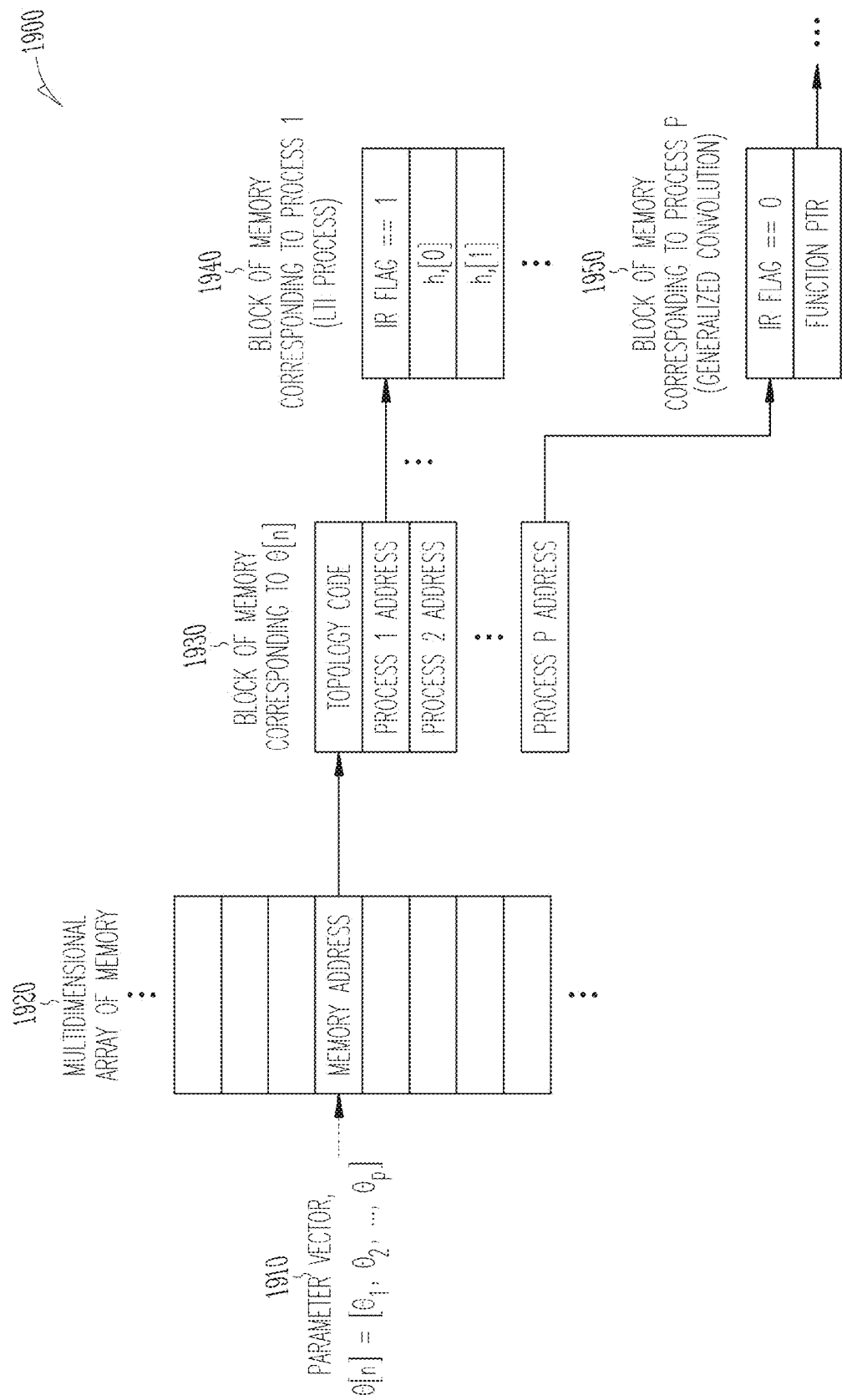
FIG. 19 shows a digital computer implementation of the system-behavior determination operation based on look-up tables according to various embodiments of the present subject matter.

FIG. 19 shows an exemplary digital computer embodiment of the system-behavior determination operation based on look-up tables 1900 according to various embodiments of the present subject matter. FIG. 19 shows an exemplary digital computer embodiment of the system-behavior determination operation based on look-up tables. In this embodiment of the present subject matter, the point in behavior space corresponding to the current determined individual process parameter values takes on integer values 1910. The integer values 1910 may each correspond with one or more indices within a multidimensional array of memory addresses 1920 stored in a computer. At each moment in time, the current parameter value vector 1910 may be used to index into this array 1920, and the memory address at the specified index may be followed to a block of memory 1930 that specifies the system behavior for that particular set of parameter values. The first entry in this block of memory 1930 may be a code that specifies a combination topology for the outputs of the LTI process 1940 or for the outputs of the generalized convolutions 1950.

The remaining entries may contain one memory address per individual process. For example, the embodiment in FIG. 19 contains P such processes. The first value pointed to by each of these individual process addresses may be a Boolean flag indicating whether the process may be linear time-invariant (LTI). If Boolean flag indicates that the process is LTI, the entries following the flag specify the impulse response for that LTI system. If the process may be nonlinear, the flag may be set to false, and the subsequent single entry may be a function pointer used to evaluate the generalized convolution kernel for that nonlinear process. This effectively implements the overall system again recursively, as may be discussed in detail later. This look-up process repeats until all individual processes terminate at a set of LTI system impulse responses, which may be then combined and evaluated according to the indicated output topologies in order to form the system output. While FIG. 19 shows a simple example, more complex embodiments may require the storing and interpreting of additional metadata for each process and response.

In order to enable the simultaneous implementation of several types of processing in this continuously time-varying and general way, all possible system behaviors may be discussed using a consistent, general architecture: at all times, the system performs one or more generalized convolutions with input signals and combines the results of these convolutions according to a topology consisting of series and parallel connections to form the output signal. Thus, each point in behavior space dictates a set of generalized convolution kernels and a topology for combining the convolution outputs. These convolution kernels and combination topologies may be designed to best achieve the overall processing results specified by the associated set of individual process parameters, taking possible interactions between processes into account, and may be designed to vary in such a way across nearby points in behavior space that overall system behavior may be guaranteed to vary smoothly while changing in response to properties of the input signal.

By describing the overall system behavior in this way, the system may be able to manage interactions between multiple individual processes. It may be often easiest to describe a desired overall processing system as a signal-flow graph consisting of several discrete, well-understood parts that each serve a particular function. However, complicated interactions between the effects of these individual processes in the presence of nonlinearity generally dictate that when the parameters of one process may be changed, the parameters of other processes must also be changed in order to compensate and keep their contribution to the overall system equivalent. These compensating changes may be difficult to derive for many multi-process systems when using common parameterizations and implementation architectures for each discrete process, which may vary significantly depending on the type of process being implemented. Further complication arises when imposing time-varying behavior on a multi-process system in which the various processes may be implemented using different architectures, as each individual architecture may have unique restrictions on its ability to change over time and may produce varying artifacts or undesirable consequences when changing configuration or parameter values.

In order to allow better time-varying control of multiple simultaneous processes, an alternative approach may be used to control overall system behavior through the adjustment of individual process parameters. In particular, the desired overall system behavior for each combination of individual process parameters may be specified through the use of one or more generalized convolutions that may or may not reflect various discrete processing components, and that can be designed without the restrictions of discrete component parameterizations in order to better maintain overall desired system characteristics. The system response kernels for these convolutions can then be made to vary smoothly in response to changes in individual process parameters, allowing the system behavior to change smoothly over time and in a way that preserves the desired overall processing across all possible behavior trajectories without the need for directly analyzing the complex interactions between individual processes.

Furthermore, by implementing all processing as generalized convolutions, overall system implementation may be simplified: various processes may be achieved using varying generalized convolution kernels rather than varying architectures and techniques, and consistent time-varying behavior can be achieved across all processes in the system. Additional analysis and modifications are discussed below in more detail.

Multiplexed Convolution: Adaptive, Signal-Aware Control of System Behavior

The first step in determining the system response at any particular moment in time may be to determine where, in behavior space, the system should be operating based on the current input signal content. If we denote the location of the system in behavior space at time sample n as $\theta[n]$, we can express this procedure as evaluating part of the operator $H\{\bullet\}$ presented in equation (10) as $$\theta[n] = H_\theta\{\text{SHIFT}_{-n}\{x\}\}, \quad (3)$$

where $$H\{\bullet\} = H_h\{H_\theta\{\text{SHIFT}_{-n}\{x\}\}\} \quad (14)$$

gives a decomposition of the relationship between input signals x and system response h, denoted as $H\{\bullet\}$, into two separate steps: one operation which analyzes signal properties and maps to a point in system behavior space, $H_\theta\{\bullet\}$, and another operation which maps from that point in system behavior space to a description of system behavior in terms of generalized convolution kernels and system topology, $H_h\{\bullet\}$. Here, our behavior space, which we may refer to as $\Theta$, may be a p-dimensional space, where p may be the number of parameters characterizing the operation of the system, and we have that $\theta[n] \in \Theta$ for all n.

In general, $\Theta$ need not be a continuous space; in some cases we may only allow $\theta[n]$ to take on values from a specific, discrete collection of settings or values. Note that FIG. 18 shows signal analysis and $H_0\{\bullet\}$ as separate blocks. This may be caused by embodiments of the presently disclosed subject matter in which the types of signal analyses performed and the way that their results map into behavior space may be separable, such as depicted in FIG. 18. However, it may be more useful to describe $H_\theta\{\bullet\}$ as representing all processing from input signals to $\theta[n]$.

In general, any available data may be analyzed and used to determine the value of $\theta[n]$ at each point in time, including additional metadata supplied to the presently disclosed system separately from the input signals themselves. Furthermore, the relationship between analysis results and $\theta[n]$, represented by $H_\theta\{\bullet\}$, may itself be controlled or adjusted by higher-level parameters resulting from signal analysis or external controls. Depending on the particular implementation, this may be thought of as selecting one $H_0\{\bullet\}$ from a collection of options or as warping the function mapping between signal analysis results and points in behavior space by some additional operation $W: \Theta \rightarrow \Theta$, as $W\{H_\theta\{\bullet\}\}$. An example of a high-level parameter that might be used in this manner would be a specification of the general type of digital signal being processed, either determined through automatic classification or through manual specification by an operator prior to processing. This capability of altering $H_0\{\bullet\}$ itself may be most applicable to embodiments of the presently disclosed subject matter that may be used for processing numerous types of signals, where the types of signals are fundamentally different in structure. In other embodiments, this capability of altering $H_0\{\bullet\}$ itself may be excluded when not needed.

In embodiments of the presently disclosed subject matter where the disclosed system is applied to audio signals, input signal properties such as spectral content, energy or perceptual loudness, the presence of transient changes in intensity or energy. Additionally, signal property relationships between multiple input signals designed to be reproduced together acoustically using a multichannel speaker array may play a large role in determining $\theta[n]$ at any moment in time. An exemplary signal-analysis subsystem that considers these properties may be depicted in FIG. 18. In these embodiments, higher-level parameters such as the type of audio content contained in the signal (a specific instrument, speech, a musical recording adhering to a particular genre, etc.) may be determined automatically from analysis of the audio signals or specified manually by an operator through some type of user interface in order to determine the appropriate behavior space mapping $H_\theta\{\bullet\}$ for the current class of signal.

In one embodiment of the present subject matter, the entire durations of previously recorded digital signals may be analyzed and considered when determining the varying modifications to be made across the duration of the signals. In another embodiment of the presently disclosed subject matter, modifications may be made to digital signals in real-time that may be, as they may be being created, recorded, or presented as a stream of data. In this embodiment, analysis of the digital signals' previous and current content may be used in determining the modifications to be made to the signals at the present moment, or an overall delay may be imposed on the throughput of the system such that some amount of future data may be considered when determining the modifications to be performed. Furthermore, analyses of multiple signals that may be somehow related may inform the processing of those signals in any relevant way. For example, the same modifications may be applied to multiple digital signals as determined by analyses performed on each signal in the collection, multiple signals may be analyzed and modified independently, or an analysis of an entire collection of signals may inform the varying modifications to be made to each signal in the collection. Each of these exemplary configurations as well as other analysis and control configurations may be relevant and useful in various contexts. These analysis configurations are presented as illustrations of the wide range of possible configurations, and additional analysis configurations may be used.

Practically, the connection between analyzed signal properties and associated points in behavior space, $H_0\{\bullet\}$, may be established in any suitable form that may be accessible by the system. In one embodiment of the presently disclosed subject matter, this relationship may be stored as a collection of pre-determined digital look-up tables that relate results of signal analysis to points in behavior space. Such look-up tables may be indexed by raw, numerical analysis results, by higher-level analysis results based on a synthesis of several signal properties including logical, rule-based processing of basic analysis results, or by some other result of signal analysis. They may map to a discrete-valued behavior space, Θ, or have tabulated values that may be interpolated in order to map into a continuous Θ. In another embodiment of the subject matter, this relationship may be established by a set of parameterized equations that relate numerical results of signal analysis to coordinates in a continuous Θ.

It should be noted that the parameterizations of individual processes reflected in the coordinates of the behavior space Θ may correspond to a wide range of characteristics varying from low-level mathematical parameter values to high-level parameters describing the overall effects of processing or the degree of processing applied. The connection between points in behavior space and implemented system behavior, $H_h\{\bullet\}$, may be chosen during design of a specific embodiment and may be entirely general; the relationship may be any that can be captured by the specification of system behavior associated with each point in behavior space, as may be discussed in more detail in the following subsection.

Multiplexed Convolution: Description and Implementation of System Behavior

Various system behaviors may be achieved through the calculation of one or more generalized convolutions, and by combining the convolution outputs according to a specified system output topology. For applying these behaviors to recorded digital signals, modifications of equations (10) and (12) may be used to calculate the discrete-time generalized convolution outputs as $$y[n] = \sum_{m=-\infty}^{\infty} H\{SHIFT_{-n}\{x\}\}[m]x[n-m] \quad (15)$$

in the input delay-spread function case and $$y[n] = \sum_{m=-\infty}^{\infty} H\{SHIFT_{-(n-m)}\{x\}\}[m]x[n-m] \quad (16)$$

in the output delay-spread function case, either of which may be used.

Each point in system-behavior space may be associated with a set of generalized convolution kernels and an associated output combination topology designed to achieve the specified underlying individual process parameters. With $H\{\bullet\}$ subdivided as in equation (14), this may be represented by the operator $H_h\{\bullet\}$, which provides a mapping from points in behavior space Θ to the overall system response. Ultimately, this response may be characterized by a collection of traditional convolution kernels, one for each of P individual processes, $h_i[n]$, i=1, P, and a specified topology for evaluating and combining the outputs of these standard convolutions. Convolution with each kernel may be then evaluated using the standard discrete-time convolution operation, $$y_i[n] = \sum_{m=-\infty}^{\infty} h_i[m]x[n-m], \quad (17)$$

where $h_i[m]$ may be zero for all m<0 (as in causal systems), or at least for all m<M for some negative integer M (as in systems with some finite amount of look-ahead).

In various embodiments, system behavior may not be specified directly for all points in Θ, particularly if Θ may not be a finite set. The set of points in Θ for which system behavior may be specified may be denoted $\Theta_h$. If $H_\Theta\{\bullet\}$ may be allowed to output parameter vectors θ that may not be in the set $\Theta_h$, system behavior for those points may be determined by interpolating the generalized convolution kernels associated with nearby points in $\Theta_h$. In some embodiments of the subject matter, system behavior may be defined for all points in continuous dimensions of Θ using parametric definitions of the generalized convolution kernels or through the re-calculation of these kernels as the result of some parametric system equation whenever changes may be made to that parameter value. Various embodiments matter may specify other generalized convolution kernels and combination topologies associated with each point in $\Theta_h$.

For linear time-invariant processes, a single convolution kernel $h_i[n]$ corresponding to the impulse response of the LTI process may be specified for each point in $\Theta_h$, as this characterizes the process entirely. For nonlinear processes, a generalized convolution kernel $H\{\bullet\}$ may be specified for each point in $\Theta_h$. Note that this definition may be somewhat recursive, as the overall system may be characterized by a single generalized convolution operation as well; however, the generalized convolution kernels associated with individual processes may be t much simpler than the generalized kernel describing the overall system, as they may be meant to implement one particular function and not a collection of simultaneous functions. These individual process kernels may involve a mapping into a low-dimensional process-behavior space (one or two dimensions may be common) and performing only low-level analysis of signal properties such as amplitude and average energy. Furthermore, individual process kernels may associate only traditional convolution kernels, $h_{i\Theta}[n]$, with each point in their process behavior spaces, meaning that various embodiments of the present subject matter may contain only two levels of generalized convolution kernel hierarchy. In general, any number of levels of hierarchy may exist; we place no restrictions on the possible complexity of particular embodiments here.

Traditional convolution kernels (as used to characterize LTI systems) may be represented as a series of digitally stored numbers, representing the impulse response of a process, $h_i[n]$, over time n. Generalized convolution kernels may be stored in a manner analogous to that discussed here for the overall system: for the i-th process, a relationship between input signal analysis results and process parameter values may be specified through a relationship $H_{i\Theta}\{\bullet\}$ stored as discussed in the previous subsection, and a relationship $H_{ih}\{\bullet\}$ may be again specified that maps from these parameter values to actual system responses. As stated previously, individual process behavior-space mappings $H_{ih}\{\bullet\}$ may only map to a set of traditional convolution kernels, $h_{i\Theta}[n]$, rather than mapping again to a set of generalized convolution kernels. These traditional convolution kernels may be then each represented as a series of digitally stored numbers.

In all cases, the hierarchy of processes may eventually terminate at sets of traditional convolution kernels together with a topology for evaluating the sets of traditional convolution kernels. This information may then be used to reduce the process to a single traditional convolution kernel representing the overall response of that process at time n, starting at the last level of hierarchy and working back up to the first generalized convolution kernel addressed by the overall system. In this way, evaluation of each individual process by the overall system, whether linear or nonlinear, may yield a single traditional convolution kernel describing that system's behavior at the current time moment, $h_t[n]$. These may be then evaluated at the top level to yield the system's overall output for that time.

A system output topology must be specified in order to evaluate the overall response or output of a generalized convolution with more than one sub-process. This specification may be made in any way that may be accessible to and usable by the system. In one embodiment of the presently disclosed subject matter, predefined codes are used to indicate the particular topologies to be used. A code key containing one value for each possible process topology may be constructed, and a single code value may be associated with each point in behavior space in order to specify the particular topology that may be to be used. This embodiment may be illustrated in FIG. 18. However, other embodiments may be used where a single topology may be suitable for all possible system behaviors.

Using our developed notation, it should be noted that this method does not pertain to a specific choice of behavior space $\Theta$, or particular choices of the relationships $H_\Theta\{\bullet\}$ or $H_h\{\bullet\}$, but rather to the overall system architecture and the way in which system behavior may be specified and implemented. This unified architecture may enable well-controlled, continuously time-varying, and input-signal-dependent system behavior.

Automated Polarity Correction of Digital Audio

A polarity correction signal processing technique modifies digital audio recordings to correct the polarity of component waveforms. These corrections compensate for a lack of standards in recording technique and equipment and improve the experience of listening to digital audio by restoring natural absolute polarity to recorded sounds. Acoustic waves in air may be comprised of compressions and rarefactions to pressures above and below ambient levels. During the process of electrically recording and later reproducing these temporary changes in air pressure using microphones, recording media, and loudspeakers, headphones, or other playback devices, it may be easy for the polarity of these pressure changes to become reversed such that the reproduced acoustic waveform has rarefactions at times that the original waveform had compressions and vice-versa.

Whether or not humans can perceive such reversals in the absolute polarity of sound waves has been a topic of research and, at times, controversy; however, both scientific and anecdotal evidence exists that supports the reality and importance of correct absolute polarity in the perception of sound. At a low level, it has been observed that the peripheral auditory system of cats exhibits "microphonic" electrical responses that differ in polarity when presented with pulses of compression and rarefaction, demonstrating that the absolute polarity of sound does affect the fundamental input signal to the auditory system. Studies of spatial sound perception in humans have further supported the theory that different neural signals may be transmitted from the peripheral auditory system in response to compression and rarefaction stimuli, in some cases going so far as to indicate that the human auditory system may only respond to one of the two conditions (rarefaction), meaning that the auditory system receives only a half-wave rectified version of full acoustic signals.

At a higher level, evidence of perceptual sensitivity to absolute polarity has been demonstrated in several experiments involving human listeners. For example, when presented with periodic waveforms that differ in shape during the positive (compression) and negative (rarefaction) portions of each period, listeners have been able to identify reversals in absolute polarity with nearly 100 percent accuracy for some waveforms and listening volumes. Furthermore, the previously mentioned experiments in spatial hearing have demonstrated that the absolute polarity of transient signals can affect their perceived timing. Together, these results demonstrate that absolute polarity may be important to the perception of both sustained and transient sounds.

Significant anecdotal evidence in support of sensitivity to absolute polarity exists in the audio community as well, with many advocates stating that correct absolute polarity has substantial positive effects on perceived sound quality and suggesting explanations for why others may feel that they cannot perceive a difference in quality associated with the polarity of recordings. Often, these explanations include the fact that many modern recordings do not allow for the clear observation of correct absolute polarity during playback because the recordings may be comprised of many channels of audio that have been mixed together with little concern for the preservation of absolute polarity, resulting in recordings that contain a mixture of sounds with both natural and unnatural polarities. In this case, reversing the polarity of a recording as a whole during playback (by reversing the leads on a speaker, for example) cannot simultaneously correct the polarities of all of the component sounds, resulting in little discernible preference for either overall polarity and masking the perceptual benefits of correct absolute polarity.

Perhaps surprisingly to the layperson, the audio industry has only begun to adopt standards and practices to regularize and preserve the absolute polarity of recorded music in any widespread manner during the last twenty years. Even through the 1980's, a universal agreement was lacking between recording studios in Europe and the USA (and between studios within the USA itself) on how the leads of the ubiquitous three-wire balanced line, or XLR cable, should be related to absolute polarity. Because this type of cable can be wired in two configurations that each carry sound but that produce output with opposite polarities, this lack of standardization inevitably resulted in numerous polarity inconsistencies, particularly in recordings where individual tracks were recorded in multiple studios and later combined. Furthermore, makers of electronic hardware devices that process, amplify, or mix electrical audio signals have never standardized design or reporting of the absolute polarity of their devices; in many cases it may be left to careful engineers to perform tests on equipment themselves in order to determine if the device outputs signal with the same or opposite polarity as its input.

While in many cases modern digital audio workstations can aid in the identification of absolute polarity errors during recording and mixing, the music industry's history of general disregard for absolute polarity has continued to dominate recording and equipment-design practices, and even today the preservation of absolute polarity may be generally only considered at the very highest levels of professional audio work. Considering that the vast majority of the publics' consumed popular music, including the several trillions of digital multimedia files available online, may be increasingly being produced by small independent studios or personal residential studios where even the most basic polarity-aware practices may be lacking, it may be no surprise that most modern audio recordings continue to exhibit a mix of absolute polarities which cannot be corrected simply by inverting output as a whole during playback. Because of this, it may be desirable to develop digital signal processing techniques by which the absolute polarities of the individual sounds making up a recorded audio mixture may be corrected independently so that natural absolute polarity can be restored to all elements of a completed recording simultaneously.

A method for processing digital audio signals in order to correct the polarities of the individual component sounds that make up a recorded audio mixture, or song, may be disclosed. The method consists of analyzing a digital audio recording and inverting component waveforms that may be determined to exhibit unnatural absolute polarity. Both transient events and sustained content (e.g., steady-state content) may be considered and processed. This method may compensate for modern recording techniques and equipment that fail to preserve the natural absolute polarity of recorded sounds and thus produce final mixed recordings where component sounds exhibit a combination of natural and inverted polarities. By establishing natural absolute polarity for all individual sounds without otherwise altering the content of these audio recordings, this method improves their perceived quality without changing their creative content.

Figure 20A:
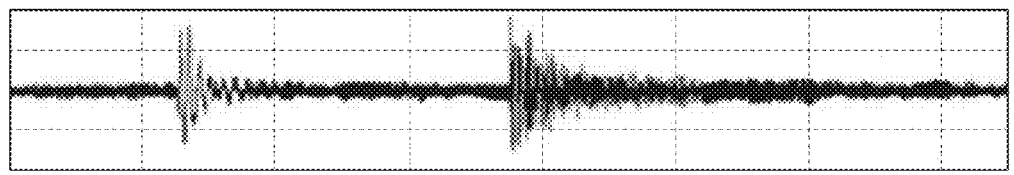
FIGS. 20A-20D illustrate an audio mixture decomposition according to various embodiments of the present subject matter.
Figure 20B:
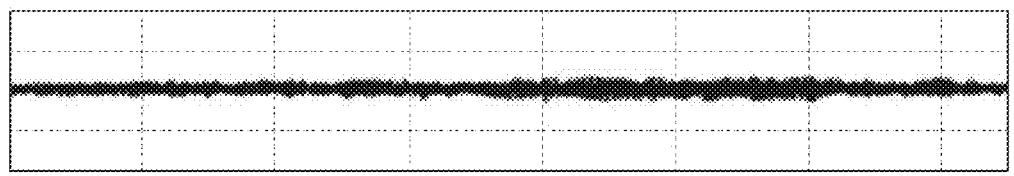
Figure 20C:
Figure 20D:
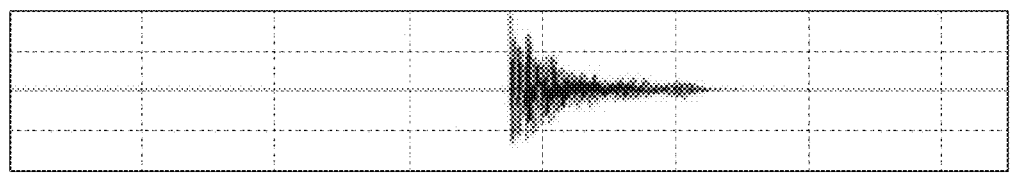

FIGS. 20A-20D illustrate an audio mixture decomposition 2000 according to various embodiments of the present subject matter. FIG. 20A illustrates an audio mixture including recorded sounds with transients and sustained components. The audio mixture in FIG. 20A may include a sustained component 20B (e.g., steady-state component) and a transient component 20C-20D. Transient events may include a first transient component 20C or a second transient component 20D. This mixture may be decomposed into its components for further analysis and polarity correction.

Figure 21A:
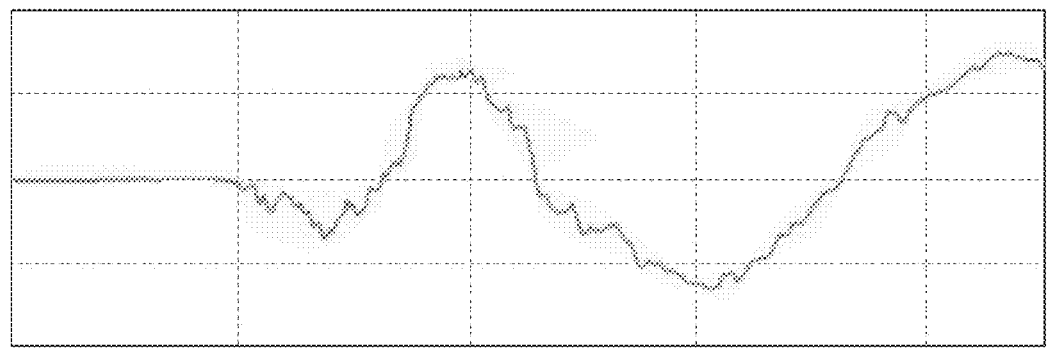
FIGS. 21A-21C show the beginnings of the transient audio events according to various embodiments of the present subject matter.
Figure 21B:
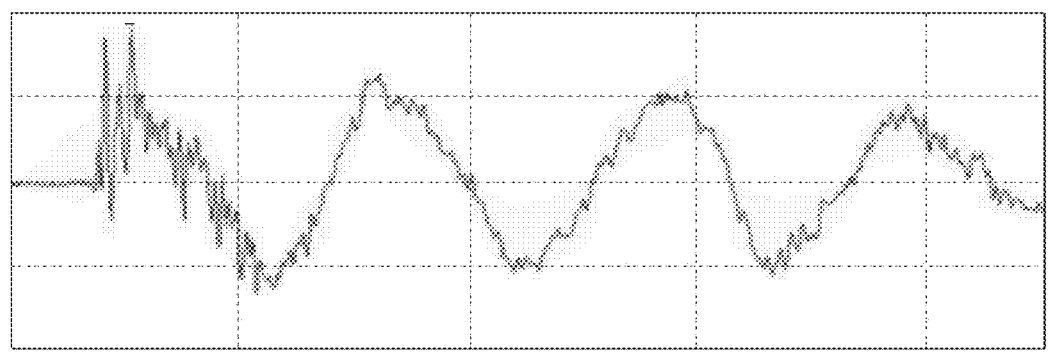
Figure 21C:
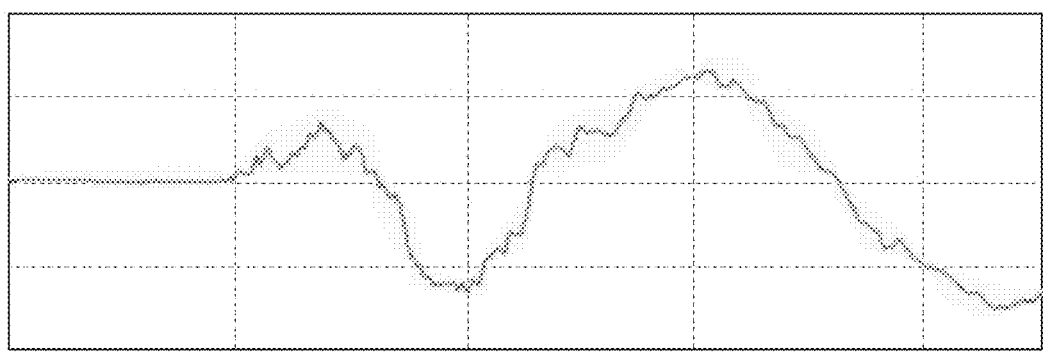

FIGS. 21A-21C show the beginnings of the transient audio events 2100 according to various embodiments of the present subject matter. FIGS. 21A-21C show the beginnings of the transient audio events shown in FIG. 1, demonstrating that the polarities of these two percussive waveforms may not be consistent; in fact, transient component 1 shown in FIG. 21A, corresponds to the waveform generated by an acoustic kick drum that has been recorded with inverted and unnatural polarity, while transient component 2 shown in FIG. 21B corresponds to a waveform generated by an acoustic snare drum and recorded with absolute polarity preserved. FIG. 21C shows the effect of inverting the polarity of a component waveform: the sign of the waveform values may be simply inverted, interchanging compression and rarefaction in the eventually reproduced acoustic wave.

The system takes as its input one or more signals that each represent the amplitude of an audio waveform over time. These signals may each be a series of digitally stored values representing the instantaneous amplitude of a band-limited waveform that has been sampled at regularly spaced moments in time.

In one embodiment, the system initially analyzes the input signal(s) to identify transient events: regions of time where one or more properties of the signal change rapidly. In audio signals, these events may coincide with percussive sounds, both tuned (mallet instruments, piano, plucked strings, etc.) and untuned (drums, traditional percussion), but these events may include any kind of signal whose energy level or other properties change significantly over a period of time relevant to the momentary perception of sound (for example, such time periods may be on the order of ones to tens of milliseconds). Those proficient in the art of audio transient analysis may know of numerous approaches to the detection of various types of transients in audio material. Any combination of these techniques may be used to identify transient events contained in a digital audio recording.

Once a transient event has been identified, a model of the surrounding audio may be formed, and the transient content may be separated from its background signal content. In doing so, various modeling techniques may be used. The particular type of model and modeling parameters used to separate each transient event from its background may depend on an initial analysis of the region of audio under inspection, and may be chosen by automatic means with the goal of optimally preserving all perceivable properties of the recorded sound.

After separation, the polarity of the transient content may be examined to determine if the initial rise of the signal and overall polarity correspond to naturally occurring absolute polarity. If the component waveform may be already found to have natural absolute polarity, the background model and separated transient waveform may be discarded and that time-region of the original audio recording may be left unaltered. If the transient component waveform may be found to have unnatural polarity, it may be inverted to restore natural absolute polarity and then recombined with the rest of the audio mixture using the previously established background model. This corrected and recombined time-region of the mixture may then undergo additional automatic processing to match the regions of the original recording optimally that come before and after it in time.

In addition to this treatment of transient events, the polarity of sustained components (e.g., steady-state components) of an audio mixture may be analyzed. In this case, a further analysis of the audio recording may be performed after the polarity of transient waveforms have been analyzed in order to determine if the surrounding sustained or steady-state content has natural absolute polarity. If it may be determined that both the background content and the transient content it surrounds have unnatural polarity in need of correction, the entire waveform of the original recording may be inverted over the duration of the examined time-period in order to restore natural absolute polarity to the entire mixture instead of inverting only the transient component and then recombining it with a model of the mixture.

In general, when considering both transient and sustained sound polarity, the entire digital audio recording may be analyzed to determine where background models should be used and where original waveforms may be inverted in full to restore consistently natural absolute polarity. Various embodiments may optimize these determinations to avoid the use of background-model-based separation and recombination wherever possible in favor of direct, complete polarity reversals of the original digital audio recording. It should be noted that in general any processing may be adaptive and may adjust to the content of the particular digital audio recording being processed such that optimal results may be achieved. In particular, various analysis and modeling techniques may be chosen for use based on automatic analysis of the digital audio recording's content, or may optionally be specified by an operator using either high-level controls that emphasize particular goals or low-level controls that directly indicate and parameterize the algorithms used.

In one embodiment of the present subject matter, an emphasis may be placed on correcting low-frequency transients that often correspond to kick drums and similar low-frequency percussion. Because these components of an audio recording often contain considerable energy and exhibit waveforms that may be highly asymmetrical in their initial attack period, they may be especially good candidates for perceptual sound improvement by absolute polarity correction. In this embodiment, transient detection schemes that favor or exclusively target low-frequency transients may be employed, and background signal modeling for isolation of the transient may leverage the fact that only low-frequency content need be isolated. In other embodiments such an emphasis may be placed on low-frequency transients.

In another embodiment, a digital audio recording may be analyzed in its entirety for a DC bias and inverted if necessary to establish a positive DC bias, thereby establishing a predominantly positive (compressive) polarity for the recording. This embodiment may be perhaps the simplest illustration of an absolute polarity correction that does not explicitly analyze the initial rise of transients or other component waveforms, and that may be suitable for use in correcting the absolute polarity of sustained waveforms with initial rises and polarities that may be more difficult to identify. Various techniques may be used to establish correct absolute polarity for sustained or other component sounds.

Use of the Identification Word to Obtain Device, Service, and Settings Information A method enables identification of the audio transducer and application of the identifier to enable enhancement algorithms may be used to enhance the listening experience. The identification may contain a unique multi-bit identification word, created during manufacture of the device, which may be interrogated by a silent pulse through the audio connection. The identification word may be used to lookup information in one or more databases. The databases may reside on the player device, as well as on remotely connected systems, such as cloud-based content delivery systems. Users of these systems may purchase and register to enable premium audio enhancements, using the identification word to identify the user and the device uniquely.

Figure 22:
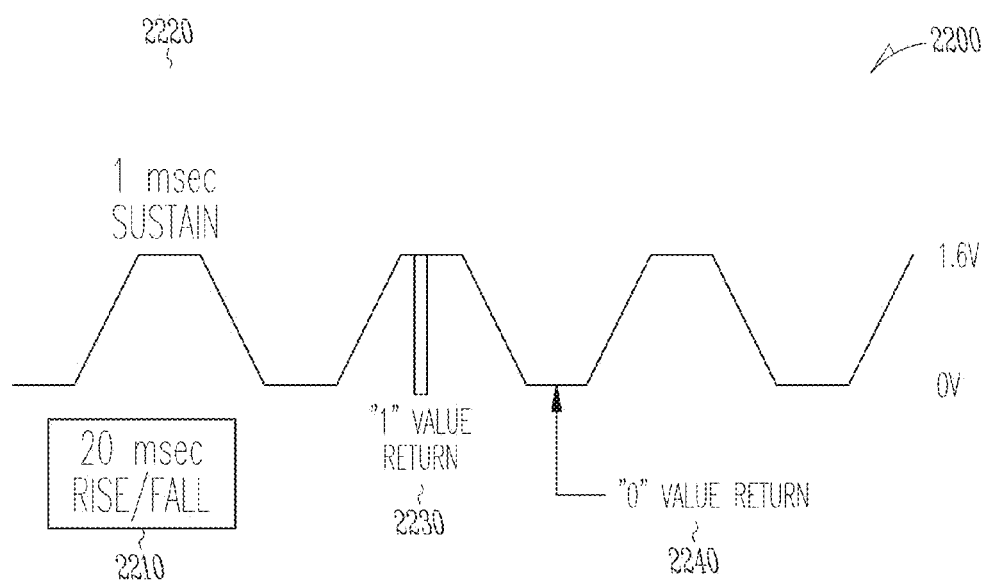
FIG. 22 demonstrates a Digital Human Interface Identifier (DHI-ID) Serial Protocol according to various embodiments of the present subject matter.

FIG. 22 demonstrates a Digital Human Interface Identifier (DHI-ID) Serial Protocol 2200 according to various embodiments of the present subject matter. Various methods may be employed to interrogate the identifier from the audio transducer. In one method, the identification process may originate with a 16-bit ultra-sonic inquiry command sent from an audio port to the audio transducer. The transducer may respond with a unique identifier of between 24 and 48 bits, called the Digital Human Interface Identifier (DHI-ID).

In one implementation, a DHI-ID enabled smart phone may poll the ear buds via the same wires that carry the audio signal to the ear buds. The DC support power for the DHI-ID identification circuit in the ear buds may be derived from the polling command from the smart phone. As illustrated in FIG. 22, the poll signal may be a series of interrogation pulses, using a 20 msec ramp up 2210, 1 msec sustain 2220, and 20 msec ramp down 2230, so as to be inaudible to the user. The pulse train may use a voltage level of 1.6 volts to represent a binary 1 value 130 and may use 0 volts to represent a binary 0 value 140, though other voltage levels may be used. The pulse train may provide the DC power to a passive IC in the ear buds.

Figure 23:
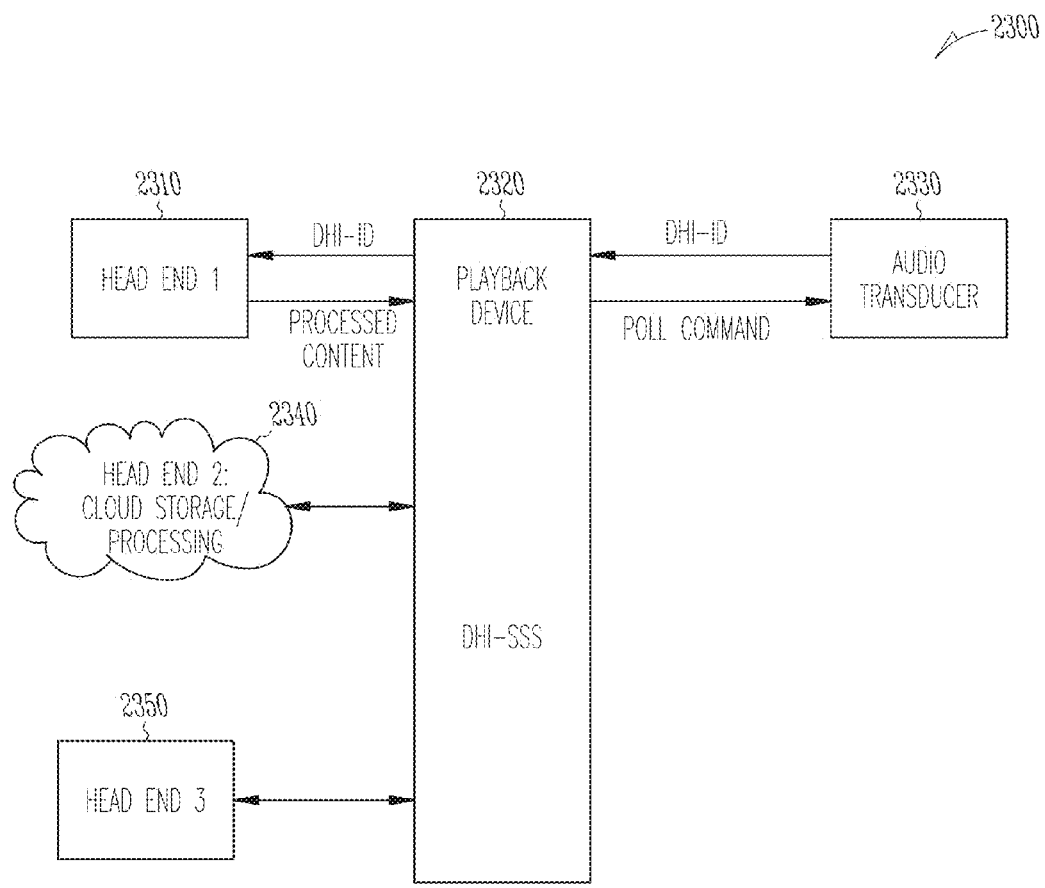
FIG. 23 demonstrates a Digital Human Interface Identifier (DHI-ID) Serial system according to various embodiments of the present subject matter.

FIG. 23 demonstrates a Digital Human Interface Identifier (DHI-ID) Serial system 2300 according to various embodiments of the present subject matter. In one example, the identification process may originate with a 16-bit ultra-sonic inquiry command sent from an audio port of a playback device 2320 to an audio transducer 2330. The transducer 2330 may respond with a unique identifier of between 24 and 48 bits, called the Digital Human Interface Identifier (DHI-ID).

Once fully powered, upon plugging the DHI-ID ear buds into the smart phone, the bits of the identification word may be sent back to the smart phone during the 1 msec sustain period. An identification word of 24 to 48 bits may be transmitted, allowing for identification of over 280 trillion devices.

In another implementation, the sustain time 120 may be extended by an additional 750 microseconds, to allow the enabling device to transmit data to the transducer, to write information to non-volatile memory in the DHI-ID transducer device. On subsequent interrogations, the data in non-volatile memory becomes part of the DHI-ID identification word, and can provide user-customized settings for the device. A button may also be provided with the audio transducer to initiate the identification process, and enable or disable the use of the DHI-ID.

The identification word (DHI-ID) may be used to obtain the device specifications, service information, and settings, collectively called the DHI-SSS. The DHI-ID may be a key used for lookup in databases local to the player, and in remote server databases. The device specifications include the manufacturer, date, model, color, impedance, frequency response, output sensitivity, dimensions, acoustic dimension, and other characteristics of the device. The specifications may be provided by the manufacturer for each device model that supports DHI-ID features. The device specifications can be used to control parameters of the sonic processing algorithms, such as frequency response to control equalization.

Service information includes whether the device may be permitted to enable proprietary sonic processing for enhanced acoustic reception at the host device or at a streaming head end content source, such as head end 1 2310, head end 2 2340, or head end 3 2350. These non-manufacturer, non-user settings may be derived from a stored enabling device rewritable look-up table, or, other updatable online file sources, in the player 2320, the transducer 2330, or the cloud storage/processing (e.g., head end 2 2340). User-controllable settings may include EQ parameters, sensitivity, and other listener/user settings.

Several novel aspect of this system that can be appreciated including (a) allowing the consumer to purchase an Acoustic Processing DHI-SSS enabled set of headphones, or (b) allowing the use of these headphones to enable free premium audio processing or a premium right to listen, which may be built into and sold with the hardware itself.

Because service information may resides in updatable files which can reside either in the rewritable chip in the ear bud or headphone, in the player devices look up tables, or at the head end, a consumer can buy a subscription to an upgraded sound along with their listening hardware, and, can carry that permission within their audio playing device or earphones or ear buds. As well, the rights could be also be made dynamic, and, if necessary, terminated after a subscription expiration date, in the same three locations, cloud, player or ear bud/DHI enabled hardware.

The system uses the DHI-SSS information to control, acoustically alter and/or process the content that may be being delivered to the audio transducer from various sources, including stored local content and streaming content from a head-end.

The DHI-SSS may be used to control the processing of modified audio and video at the content's storage and consumer streaming source location, for both streamed and broadcast sources, as directed by the DHI-SSS derived from the DHI-ID from the listening device, or by other means. Processing of the content can be performed on the server and stored for later streaming, or processed in real-time by the server, or processed in real-time by the player if processing bandwidth may be sufficient.

The process controller may select/enable DHI-ID content processing in both streaming and broadcast usage. The DHI-ID controls the processing originating from streaming web (or any other digital transmission system) head-end server(s), or from broadcasting radio transmitter(s), for the purposes of achieving an enhanced Digital-Human Interface (DHI) customer content experience, or any other processing necessary. This processing may be used a business-to-consumer function, and may also be used as a business-to-business function.

The user may have content processing available both on-command from the Server/Broadcast end or by selecting one or more control inputs. Control inputs may include selection of a song (e.g., track), a video, or a duration. For example, the duration may be selected as always active, active hourly, active for any unit of time, or active according to a pre-determined time pattern. Example instances may include only active on weekends, only active on afternoons, active for 30 days total, active for the first 10 songs, active for every purchased movie over $12 in cost to the consumer, or another duration. The duration may be selected by the service providing the content or by the consumer.

The processing software may be installed automatically at any processing location using an automated, process-controller controlled batch process. Automatic installation may occur instantly or over a pre-determined time. Installation may be configured to allow the process to be deployed quickly and effectively.

The processing control innovation includes a dual-input, online visual control interface allowing the streaming operators to select which stream(s) may be processed, as well as processing them according to the multiple processing job combinations.

The control interface can have as its input selections for processing made by the consumers' elective (paid for, in general) upstream choices. An example of this upstream dashboard input would be the use of a consumer smart phone app that would allow the consumer to pay for DHI-ID processing of songs to be streamed to them.

The streaming/broadcast control innovation allows for the operator choice of processing the content a) in a batch format, thereby having the processed content reside on the source storage element permanently, giving two existing versions of the content for the control process controller to select from, or b) in real-time, where each individual content unit (stream or broadcast) may be processed anew for each processor controller request. Usage configuration (b) may halve the content file storage requirements, and usage configuration (a) may correspond to the instantaneous, no real-time CPU processing necessary.

FIG. 23 demonstrates the use of the DHI-ID and DHI-SSS in an exemplary system. The Audio Transducer may be polled by a playback device 2320, such as a smart phone or tablet. The Audio Transducer responds with its identifier, the DHI-ID.

Content may reside in several locations in the system, including the playback device, head-end distribution channels, and cloud storage. In one use scenario, the DHI-ID may be used to retrieve the DHI-SSS from an internet database. The service information of the DHI-SSS may be then used to enable processing algorithms of content stored locally on the playback device.

In another use scenario, the DHI-ID may be sent to a head-end processor. The identifier may be used to enable the real-time processing of content that may be streamed from the head-end to the playback device.

In a third scenario, content has been placed in cloud storage. The content may be pre-processed by the cloud, or processed in real-time as files may be transferred from the cloud to the playback device.

In all cases, the types of processing may be enabled by the service information and controlled by parameters included in the DHI-SSS. The following sections describe specific audio enhancement algorithms that can be enabled to provide an improved listening experience.

Figure 24:
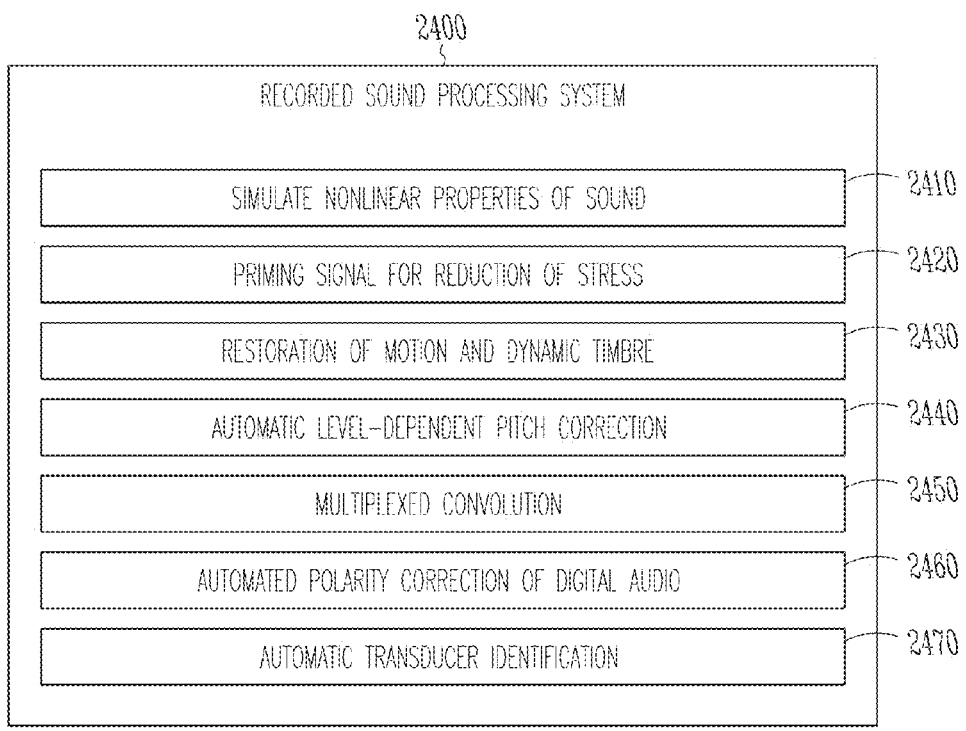
FIG. 24 demonstrates a recorded sound processing system according to various embodiments of the present subject matter.

FIG. 24 demonstrates a recorded sound processing system 2400 according to various embodiments of the present subject matter. System 2400 may be configured to perform one or more of signal processing methods 2410, 2420, 2430, 2440, 2450, 2460, and 2470. Any of the methods in system 2400 may be used individually or in any combination with any other method in system 2400. All signal processing methods 2410, 2420, 2430, 2440, 2450, 2460, and 2470 may be used simultaneously. In various embodiments, system 2400 may be configured to perform any one or any combination of methods 2410, 2420, 2430, 2440, 2450, 2460, and 2470. In various embodiments, system 2400 may be configured to perform any combination of methods 2410, 2420, 2430, 2440, 2450, 2460, and 2470 simultaneously, concurrently, and/or at different times. In various embodiments, any systems and methods including their various examples as discussed in this document and their various combinations may be implemented in a system such as system 2400.

The methods in system 2400 may include the methods discussed above. System 2400 includes a method to simulate nonlinear properties of sound 2410, which may use a sound processor to model in-air mixing and live performance to implement the Digital Audio Processing to Simulate the Nonlinear Properties of Sound Propagation and Mixing in Air. Method 2420 includes priming signal to implement Digital Signal Processing of Priming Signal for Reduction of Stress in the Auditory System, in which a preconditioned signal is mixed with delayed actual signal to reduce listening stress. Method 2430 includes Restoration of motion and dynamic timbre, which uses a sound processor to phase and flange to recreate motion and liveliness to implement Digital Audio Processing for the Restoration of Motion and Dynamic Timbre. Method 2440 includes automatic pitch correction, which uses a sound processor to pitch correct based on level to implement Automatic Level-Dependent Pitch Correction of Digital Audio. Method 2450 implements Multiplexed Convolution, which processes sound with adaptive and time-varying convolutions. Method 2460 includes polarity correction, which uses a sound processor to restore natural audio polarity due to lack of recording standards to implement Automated Polarity Correction of Digital Audio. Method 2470 includes automatic transducer identification, which provides processed sounds as a function of sensed transducer to implement Use of the Identification Word to Obtain Device, Service, and Settings Information.

Various examples of the present subject matter are provided as follows:

Example 1 includes a method for simulating propagation and mixing of sounds in air, the method comprising selecting a relationship between a virtual audio listener location and a virtual source location within an audio interaction volume, the audio interaction volume associated with a first audio waveform, the first audio waveform including audio generated using a first audio isotropic source; and, generating a second audio waveform using the first audio waveform, the second audio waveform including a plurality of simulated intermodulation products corresponding to the relationship between the virtual audio listener location and the virtual source location.

Example 2 includes the method of example 1, the first audio waveform further including audio generated using a second isotropic audio source.

Example 3 includes the method of any of examples 1-2, further including generating a simulated mixed output waveform, the generating including applying a first gain to the first audio waveform to generate a first amplified waveform, applying a second gain to the second audio waveform to generate a second amplified waveform, and summing the first amplified waveform and the second amplified waveform to generate the simulated mixed output waveform.

Example 4 includes the method of any of examples 1-3, further including transducing the simulated mixed output waveform into audible sounds.

Example 5 includes the method of any of examples 1-4, further including identifying an audio sample within the second audio waveform, identifying a frequency of the audio sample, and generating a frequency-dependent sample by applying frequency-dependent linear filtering to the audio sample, the frequency-dependent linear filtering simulating a frequency-dependent attenuation of the audio sample as the audio sample propagates through air.

Example 6 includes the method of any of examples 1-5, further including receiving the first audio waveform from a remote source.

Example 7 includes the method of any of examples 1-6, further including sending the simulated mixed output waveform to a remote physical audio listener location.

Example 8 includes a system for simulating propagation and mixing of sounds in air, the system comprising a digital signal processing mixing simulation module, the simulation module configured to select a virtual source location within an audio interaction volume, the audio interaction volume associated with a first audio waveform, the first audio waveform including audio generated using a first audio isotropic source; select an observation location corresponding to a virtual audio listener location; and, determine a second audio waveform using the first audio waveform, the second audio waveform including a plurality of simulated intermodulation products corresponding to the observation location; and, a summing amplifier module configured to generate a second audio waveform, the second audio waveform including the first audio waveform and the second audio waveform.

Example 9 includes the system of example 8, the first audio waveform further including audio generated using a second audio isotropic source.

Example 10 includes the system of any of examples 8-9, further including a speaker, the speaker configured to transduce the second audio waveform into audible sounds.

Example 11 includes the system of any of examples 8-10, further including a first amplifier module configured to apply a first gain to the first audio waveform to generate a first amplified waveform, and a second amplifier module configured to apply a second gain to the second audio waveform to generate a second amplified waveform, wherein the summing amplifier module is configured to sum the first amplified waveform and the second amplified waveform to generate the second audio waveform.

Example 12 includes the system of any of examples 8-11, further including a frequency-dependent linear filter module, the frequency-dependent linear filter module configured to identify an audio sample within the second audio waveform, determine a frequency of the audio sample, and generate a frequency-dependent sample by applying frequency-dependent linear filtering to the audio sample, the frequency-dependent linear filtering simulating a frequency-dependent attenuation of the audio sample as the audio sample propagates through air.

Example 13 includes the system of any of examples 8-12, further including a communication module, the communication module configured to receive the first audio waveform from a remote source.

Example 14 includes the system of any of examples 8-13, the communication module further configured to send the second audio waveform to a remote physical audio listener location.

Although the subject matter has been explained in relation to its preferred embodiment, it may be to be understood that many other possible modifications and variations can be made without departing from the spirit and scope of the subject matter as hereinafter claimed.

What is claimed is:

1. A method for simulating propagation and mixing of sounds in air, the method comprising:
    selecting a relationship between a virtual audio listener location and a virtual source location within an audio interaction volume, the audio interaction volume associated with a first audio waveform, the first audio waveform including audio generated using a first audio isotropic source; and
    generating a second audio waveform using the first audio waveform, the second audio waveform including a plurality of simulated intermodulation products corresponding to the relationship between the virtual audio listener location and the virtual source location.

2. The method of claim 1, the first audio waveform further including audio generated using a second isotropic audio source.

3. The method of claim 1, further including generating a simulated mixed output waveform, the generating including:
    applying a first gain to the first audio waveform to generate a first amplified waveform;
    applying a second gain to the second audio waveform to generate a second amplified waveform; and
    summing the first amplified waveform and the second amplified waveform to generate the simulated mixed output waveform.

4. The method of claim 3, further including transducing the simulated mixed output waveform into audible sounds.

5. The method of claim 1, further including:
    identifying an audio sample within the second audio waveform;
    identifying a frequency of the audio sample; and
    generating a frequency-dependent sample by applying frequency-dependent linear filtering to the audio sample, the frequency-dependent linear filtering simulating a frequency-dependent attenuation of the audio sample as the audio sample propagates through air.

6. The method of claim 1, further including receiving the first audio waveform from a remote source.

7. The method of claim 1, further including sending the simulated mixed output waveform to a remote physical audio listener location.

8. A system for simulating propagation and mixing of sounds in air, the system comprising:
    a digital signal processing mixing simulation module, the simulation module configured to:
        select a virtual source location within an audio interaction volume, the audio interaction volume associated with a first audio waveform, the first audio waveform including audio generated using a first audio isotropic source;

select an observation location corresponding to a virtual audio listener location; and determine a second audio waveform using the first audio waveform, the second audio waveform including a plurality of simulated intermodulation products corresponding to the observation location; and a summing amplifier module configured to generate an output audio waveform, the output audio waveform including the first audio waveform and the second audio waveform.

9. The system of claim 8, the first audio waveform further including audio generated using a second audio isotropic source.

10. The system of claim 8, further including a speaker, the speaker configured to transduce the output audio waveform into audible sounds.

11. The system of claim 8, further including:

a first amplifier module configured to apply a first gain to the first audio waveform to generate a first amplified waveform; and a second amplifier module configured to apply a second gain to the second audio waveform to generate a second amplified waveform;

wherein the summing amplifier module is configured to sum the first amplified waveform and the second amplified waveform to generate the output audio waveform.

12. The system of claim 8, further including a frequency-dependent linear filter module, the frequency-dependent linear filter module configured to:

identify an audio sample within the second audio waveform;

determine a frequency of the audio sample; and generate a frequency-dependent sample by applying frequency-dependent linear filtering to the audio sample, the frequency-dependent linear filtering simulating a frequency-dependent attenuation of the audio sample as the audio sample propagates through air.

13. The system of claim 8, further including a communication module, the communication module configured to receive the first audio waveform from a remote source.

14. The system of claim 13, the communication module further configured to send the output audio waveform to a remote physical audio listener location.

* * * * *